US012641891B2

(12) United States Patent
Chang et al.

(10) Patent No.: US 12,641,891 B2
(45) Date of Patent: May 26, 2026

(54) SEMICONDUCTOR CAPACITOR FOR IMAGE SENSOR PIXEL CIRCUITRY

(71) Applicant: Taiwan Semiconductor Manufacturing Company, Ltd., Hsinchu (TW)

(72) Inventors: Chih-Ping Chang, Tainan City (TW); Ming-I Wang, Tainan City (TW); Shyh-Fann Ting, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 376 days.

(21) Appl. No.: 18/334,618

(22) Filed: Jun. 14, 2023

(65) Prior Publication Data

US 2024/0355865 A1    Oct. 24, 2024

Related U.S. Application Data

(60) Provisional application No. 63/497,653, filed on Apr. 21, 2023.

(51) Int. Cl.
*H10F 39/18* (2025.01)
*H10F 39/00* (2025.01)

(52) U.S. Cl.
CPC .......... *H10F 39/18* (2025.01); *H10F 39/014* (2025.01); *H10F 39/8037* (2025.01); *H10F 39/811* (2025.01)

(58) Field of Classification Search
None
See application file for complete search history.

(56) References Cited

U.S. PATENT DOCUMENTS

| | | | |
|---|---|---|---|
| 6,429,470 B1 * | 8/2002 | Rhodes | ................. H10F 39/803 257/E21.018 |
| 8,105,858 B2 * | 1/2012 | Rhodes | ............... H10F 39/8033 438/70 |
| 2020/0127029 A1 | 4/2020 | Meynants | |
| 2020/0279878 A1 * | 9/2020 | Ebiko | ................. H10F 39/8067 |
| 2021/0203869 A1 | 7/2021 | Ma et al. | |
| 2022/0046195 A1 | 2/2022 | Mcelvain et al. | |

* cited by examiner

*Primary Examiner* — Michelle Mandala
(74) *Attorney, Agent, or Firm* — Eschweiler & Potashnik, LLC

(57) ABSTRACT

An integrated chip including a semiconductor substrate. The semiconductor substrate includes a first region having a first doping type, a second region having a second doping type, different than the first doping type, and a third region having the second doping type. A photodetector is in the semiconductor substrate. The photodetector is formed, at least in part, by the first region and the second region. A first capacitor electrode is over the third region of the semiconductor substrate. The first capacitor electrode includes a semiconductor. A first insulator layer is between the first capacitor electrode and the third region. A capacitor is along the semiconductor substrate. The capacitor is formed, at least in part, by the first capacitor electrode, the third region, and the first insulator layer.

20 Claims, 18 Drawing Sheets

600

700

1100a

1100b

1600a

1600b

1700

1800

1900

2000

2100

3000

3100

3200

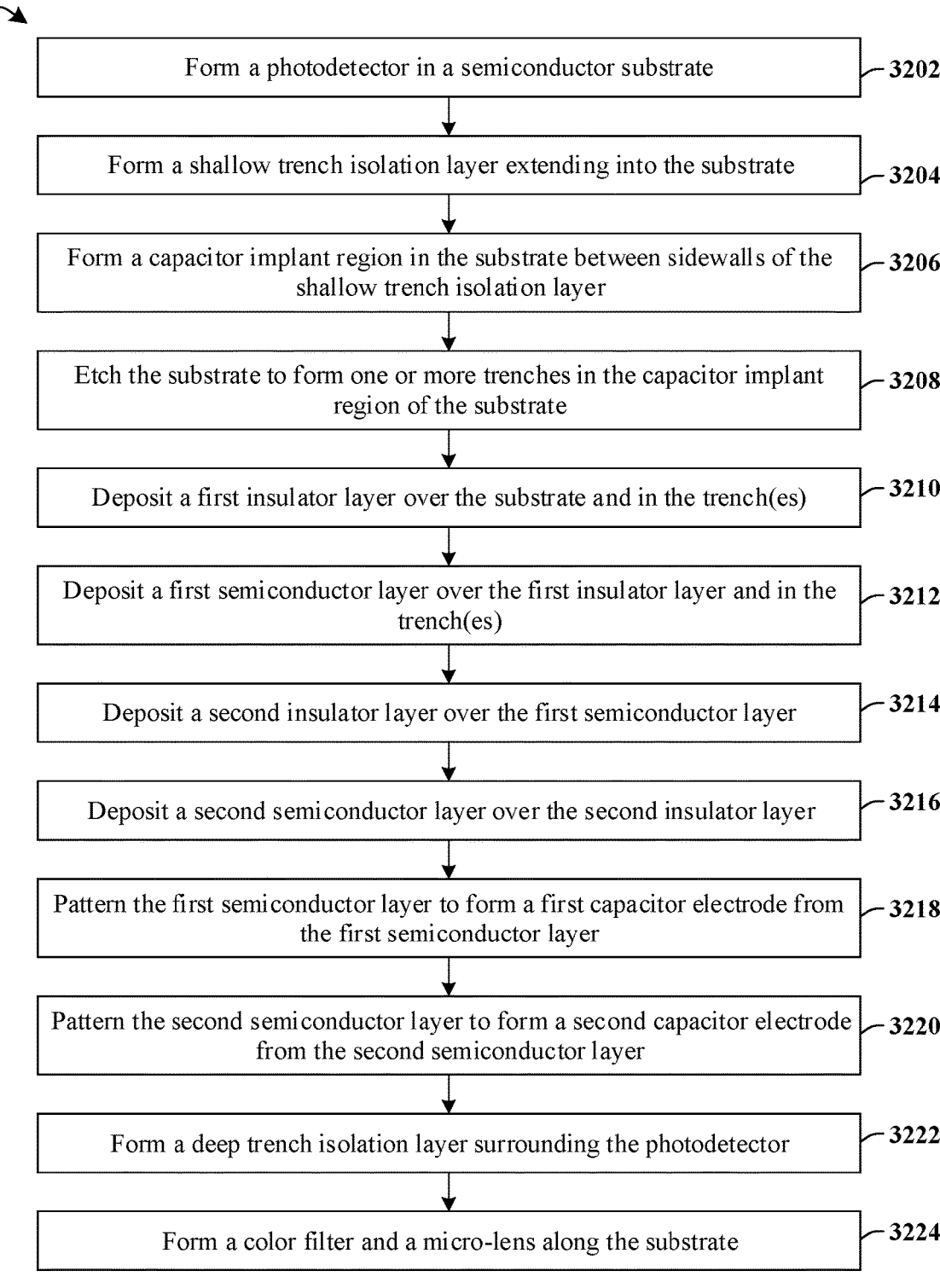

Form a photodetector in a semiconductor substrate — 3202

Form a shallow trench isolation layer extending into the substrate — 3204

Form a capacitor implant region in the substrate between sidewalls of the shallow trench isolation layer — 3206

Etch the substrate to form one or more trenches in the capacitor implant region of the substrate — 3208

Deposit a first insulator layer over the substrate and in the trench(es) — 3210

Deposit a first semiconductor layer over the first insulator layer and in the trench(es) — 3212

Deposit a second insulator layer over the first semiconductor layer — 3214

Deposit a second semiconductor layer over the second insulator layer — 3216

Pattern the first semiconductor layer to form a first capacitor electrode from the first semiconductor layer — 3218

Pattern the second semiconductor layer to form a second capacitor electrode from the second semiconductor layer — 3220

Form a deep trench isolation layer surrounding the photodetector — 3222

Form a color filter and a micro-lens along the substrate — 3224

Fig. 32

SEMICONDUCTOR CAPACITOR FOR IMAGE SENSOR PIXEL CIRCUITRY

REFERENCE TO RELATED APPLICATION

This application claims the benefit of U.S. Provisional Application No. 63/497,653, filed on Apr. 21, 2023, the contents of which are hereby incorporated by reference in their entirety.

BACKGROUND

Complementary metal-oxide semiconductor (CMOS) image sensors are used in a wide range of modern-day electronic devices, such as, for example, cameras, tablets, smart phones, and so on. CMOS image sensors may be front-side illuminated (FSI) or back-side illuminated (BSI). Compared to FSI image sensors, BSI image sensors have better sensitivity, better angular response, and greater metal routing flexibility.

Many modern integrated chips include transistors as well as passive devices. Some examples of passive devices include capacitors, resistors, inductors, varactors, etc. Passive devices are widely used to control integrated chip characteristics, such as gains, time constants, etc. Some passive devices include integrated passive devices (IPDs). An IPD is a collection of one or more passive devices embedded into a single monolithic device and packaged as an integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 32 illustrates a flow diagram of some embodiments of a method for forming an integrated chip including a pixel along a semiconductor substrate and a semiconductor capacitor along the pixel.

DETAILED DESCRIPTION

Figure 1:
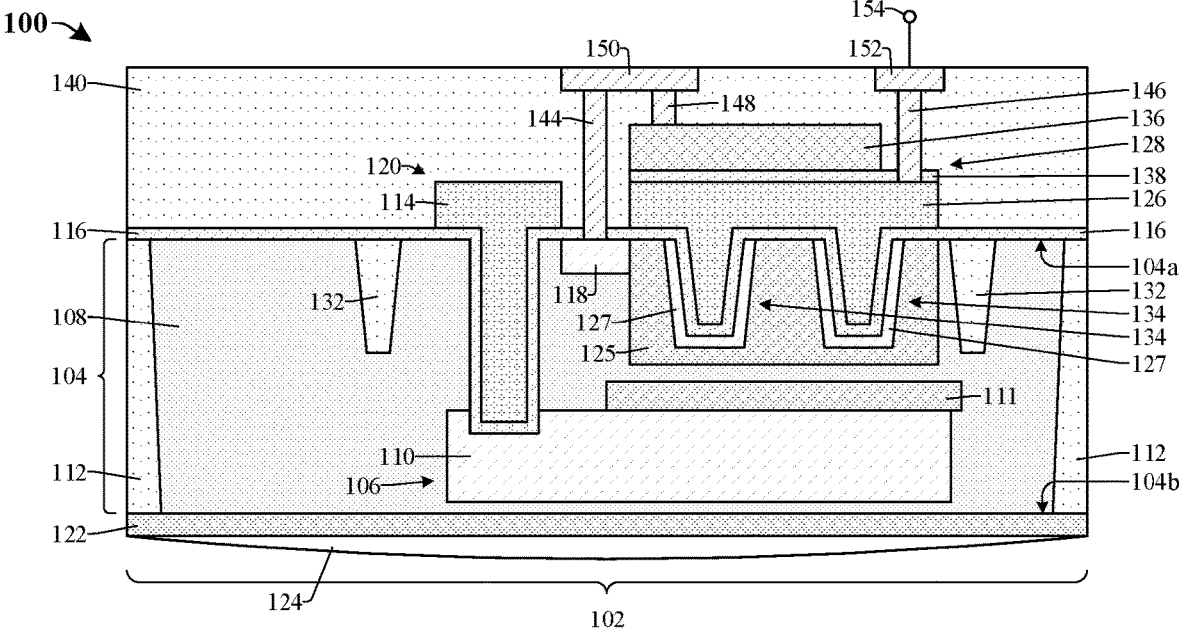
FIG. 1 illustrates a cross-sectional view of some embodiments of an integrated chip including a pixel along a semiconductor substrate and a semiconductor capacitor along the pixel.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes an image sensor. The image sensor includes a pixel along a semiconductor substrate. The pixel includes a photodetector in the substrate. The pixel further includes a semiconductor capacitor arranged along the substrate. For example, the substrate includes a bulk region having a first doping type and a capacitor implant region having a second doping type. A first capacitor electrode is over the capacitor implant region, and a first insulator layer is directly between the first capacitor electrode and the capacitor implant region. The first capacitor electrode forms a first electrode of the semiconductor capacitor, and the capacitor implant region forms a second electrode of the semiconductor capacitor.

Increasing the capacitance of the semiconductor capacitor can be challenging. For example, increasing the total capacitance of the semiconductor capacitor can be achieved by increasing the lateral area semiconductor capacitor. However, increasing the lateral area of the semiconductor capacitor may decrease the area available along the substrate for the photodetector. Decreasing the area available for the photodetector may reduce the fill factor of the pixel (e.g., the ratio of the photosensitive area of the pixel to the total area of the pixel).

In various embodiments of the present disclosure, the capacitance of the semiconductor capacitor can be increased without reducing the fill factor of the pixel. For example, in some embodiments, the photodetector is buried in the semiconductor substrate and the semiconductor capacitor is disposed directly over the photodetector. Thus, the lateral area of the semiconductor capacitor can be increased without reducing the area of the photodetector. As a result, the capacitance of the semiconductor capacitor can be increased without reducing the fill factor of the pixel.

In some embodiments, the first capacitor electrode extends into a trench in the semiconductor substrate. Thus, the area between the first electrode and the second electrode of the semiconductor capacitor is increased in the vertical direction without increasing the lateral area of the semiconductor capacitor. As a result, the capacitance of the semiconductor capacitor can be increased without reducing the fill factor of the pixel.

In some embodiments, a second capacitor electrode is over the first capacitor electrode and a second insulator layer is directly between the second capacitor electrode and the first capacitor electrode. The capacitor implant region of the substrate is coupled to the second capacitor electrode so that the second capacitor electrode and the capacitor implant region together form the second electrode of the semiconductor capacitor. By including the second capacitor electrode over the first capacitor electrode and coupling the second capacitor electrode to the capacitor implant region, the area between the first electrode and the second electrode of the semiconductor capacitor is increased without increasing the lateral area of the semiconductor capacitor. Thus, the capacitance of the semiconductor capacitor can be increased without reducing the fill factor of the pixel.

FIG. 1 illustrates a cross-sectional view 100 of some embodiments of an integrated chip including a pixel 102 along a semiconductor substrate 104 and a semiconductor capacitor 128 along the pixel 102.

The semiconductor substrate 104 comprises a bulk region 108 and a photodiode implant region 110. The bulk region 108 has a first doping type (e.g., p-type doping) and the photodiode implant region 110 has a second doping type (e.g., n-type doping), different than the first doping type. A photodetector 106 is in the substrate 104. For example, the photodetector 106 is formed by a p-n junction between the photodiode implant region 110 of the substrate 104 and the bulk region 108 of the substrate 104. In some embodiments, the photodiode implant region 110 is buried in the substrate 104 (e.g., disposed below a first side 104a of the substrate 104). Although region 108 is referred to as a bulk region, in some embodiments, region 108 may alternatively be referred to as a well implant region having the first doping type.

A deep trench isolation layer 112 extends into the substrate 104 and surrounds the photodetector 106 along a boundary of the pixel 102. The deep trench isolation layer 112 isolates (e.g., electrically and/or optically) the pixel 102 from neighboring pixels (not shown).

A first gate electrode 114 is over the first side 104a of the substrate 104. In some embodiments, the first gate electrode 114 extends into the substrate 104 from the first side 104a of the substrate 104 to the photodiode implant region 110 of the substrate 104. A first insulator layer 116 (e.g., a gate dielectric layer) is directly between the first gate electrode 114 and the substrate 104.

The substrate 104 further comprises a first floating diffusion region 118 having the second doping type. The first floating diffusion region 118 is arranged along the first side 104a of the substrate 104 and is laterally spaced from the first gate electrode 114. The bulk region 108 of the substrate 104 extends between the photodiode implant region 110 and the first floating diffusion region 118. In some embodiments, the first floating diffusion region 118 is directly over the photodiode implant region 110.

The photodiode implant region 110, the first floating diffusion region 118, the bulk region 108, the first gate electrode 114, and the first insulator layer 116 form a transfer transistor 120. For example, the photodiode implant region 110 forms a first source/drain region, the first floating diffusion region 118 forms a second source/drain region, the bulk region 108 forms a channel region, the first gate electrode 114 forms a transfer gate, and the first insulator layer 116 forms a gate dielectric layer. Source/drain region(s) may refer to a source or a drain, individually or collectively dependent upon the context.

A color filter 122 and a micro-lens 124 are arranged along a second side 104b of the substrate 104, opposite the first side 104a. Photons (not shown) may pass through the micro-lens 124 and the color filter 122 and impinge on the photodetector 106.

The substrate 104 further comprises a capacitor implant region 125 along the first side 104a of the substrate 104. The capacitor implant region 125 has the second doping type. In some embodiments, the capacitor implant region 125 is adjacent to the first floating diffusion region 118.

A first capacitor electrode 126 is directly over the capacitor implant region 125 of the substrate 104. The first insulator layer 116 is directly between the first capacitor electrode 126 and the capacitor implant region 125 of the substrate 104. The first capacitor electrode 126, the capacitor implant region 125, and the first insulator layer 116 form the semiconductor capacitor 128. For example, the first capacitor electrode 126 forms a first electrode (e.g., first electrode 202 of FIG. 2) of the semiconductor capacitor 128, the capacitor implant region 125 forms a second electrode (e.g., second electrode 204 of FIG. 2) of the semiconductor capacitor 128, and the first insulator layer 116 forms the insulator between the first and second electrodes of the semiconductor capacitor 128.

A shallow trench isolation layer 132 is on opposite sides of the capacitor implant region 125. In some embodiments, the shallow trench isolation layer 132 surrounds the capacitor implant region 125 to isolate the capacitor implant region 125 (e.g., the second electrode of the semiconductor capacitor 128) from neighboring devices.

A dielectric structure 140 is over the first side 104a of the substrate 104. The dielectric structure 140 comprises a plurality of dielectric layers (not shown). Conductive contacts 144, 146, 148 and conductive lines 150, 152 are disposed within the dielectric structure 140.

In some embodiments, the first capacitor electrode 126 (e.g., the first electrode of the semiconductor capacitor 128) is coupled to a bias voltage supply 154. For example, in some embodiments, a conductive contact 146 is coupled to the first capacitor electrode 126, a conductive line 152 is coupled to the conductive contact 146, and the conductive line 152 is coupled to the bias voltage supply 154.

The capacitor implant region 125 (e.g., the second electrode of the semiconductor capacitor 128) is selectively coupled to the first floating diffusion region 118. For example, by controlling a bias voltage applied to the first capacitor electrode 126, the capacitor implant region 125 (e.g., the second electrode of the semiconductor capacitor 128) can be selectively coupled to the first floating diffusion region 118.

In some embodiments, the semiconductor capacitor 128 is directly over the photodetector 106 (e.g., directly over the photodiode implant region 110). Thus, the lateral area of the semiconductor capacitor 128 can be increased without reducing the area of the photodetector 106. Thus, the total capacitance of the semiconductor capacitor 128 can be increased without reducing the fill factor of the pixel 102. In such embodiments, the substrate 104 further comprises an isolation implant region 111 directly between the photodiode implant region 110 and the capacitor implant region 125 to isolate the photodiode implant region 110 from the capacitor implant region 125. The isolation implant region 111 has the first doping type.

In some embodiments, the first capacitor electrode 126 extends into one or more capacitor trenches 134 in the semiconductor substrate 104. For example, the first capacitor electrode 126 extends below the first side 104a of the substrate 104 between sidewalls of the substrate 104 that delimit the trenches 134 in the substrate 104. The first insulator layer 116 extends between the first capacitor electrode 126 and the sidewalls and upper surfaces of the substrate 104 that delimit the capacitor trenches 134. Thus, the area between the first capacitor electrode 126 and the capacitor implant region 125 (e.g., the area between the first electrode and the second electrode of the semiconductor capacitor 128) is increased in the vertical direction without increasing the lateral area (e.g., the width) of the semiconductor capacitor 128. Thus, the capacitance of the semiconductor capacitor 128 can be increased without reducing the area of the photodetector 106 and hence without reducing the fill factor of the pixel 102. In some such embodiments, because the vertical area between the electrodes of the semiconductor capacitor 128 is increased, the lateral area of the semiconductor capacitor 128 can even be decreased so that the area of the photodetector 106 (and hence the fill factor of the pixel 102) can be increased without reducing the capacitance of the semiconductor capacitor 128.

In some embodiments, the capacitor implant region 125 extends along the sidewalls and upper surfaces of the substrate 104 that delimit the capacitor trenches 134. In some other embodiments, the substrate 104 further comprises a protective implant region 127 that extends along the sidewalls and upper surfaces of the substrate 104 that delimit the capacitor trenches 134 (between the capacitor implant region 125 and the sidewalls and upper surfaces of the substrate 104 that delimit the capacitor trenches 134). In some embodiments, the protective implant region 127 has the first doping type. The protective implant region 127 may isolate (e.g., protect) the capacitor implant region 125 from damage along the sidewalls and upper surfaces of the substrate 104 that delimit the capacitor trenches 134.

In some embodiments, the depth of the capacitor trenches 134 (e.g., the distance between the first side 104a of the substrate 104 and the upper surfaces of the substrate 104 that delimit bottoms of the trenches 134) is approximately equal to or less than the depth of the shallow trench isolation layer 132 (e.g., the distance between the first side 104a of the substrate 104 and the bottom surfaces of the shallow trench isolation layer 132). Thus, the bottom surfaces of the first capacitor electrode 126 are above the bottom surfaces of the shallow trench isolation layer 132.

In some embodiments, a second capacitor electrode 136 is over the first capacitor electrode 126 and a second insulator layer 138 is directly between the second capacitor electrode 136 and the first capacitor electrode 126. The second capacitor electrode 136 is coupled to the capacitor implant region 125 (e.g., the second electrode of the semiconductor capacitor 128). For example, a conductive contact 148 is coupled to the second capacitor electrode 136 and to conductive line 150. Thus, the second capacitor electrode 136 further forms the second electrode (e.g., second electrode 204 of FIG. 2) of the semiconductor capacitor 128. By including the second capacitor electrode 136 over the first capacitor electrode 126 and coupling the second capacitor electrode 136 to the capacitor implant region 125, the area between the first electrode and the second electrode of the semiconductor capacitor 128 can be increased without increasing the lateral area (e.g., the width) of the semiconductor capacitor 128. For example, the area between the second capacitor electrode 136 and the first capacitor electrode 126 increases the total area between the first electrode and the second electrode of the semiconductor capacitor 128. Thus, the capacitance of the semiconductor capacitor 128 can be increased without reducing the area of the photodetector 106 and hence without reducing the fill factor of the pixel 102. In some such embodiments, the lateral area of the semiconductor capacitor 128 can even be decreased so that the area of the photodetector 106 (and hence the fill factor of the pixel 102) can be increased without reducing the capacitance of the semiconductor capacitor 128.

In some embodiments, the semiconductor substrate 104 comprises silicon, germanium, silicon germanium, gallium arsenide, or some other suitable material. In some embodiments, the shallow trench isolation layer 132, the deep trench isolation layer 112, and the dielectric layers of the dielectric structure 140 comprise silicon dioxide, silicon nitride, or some other suitable material. In some embodiments, the conductive contacts 144, 146, 148 and the conductive interconnects 150, 152 comprise copper, tungsten, aluminum, or some other suitable material. In some embodiments, the first insulator layer 116 and the second insulator layer 138 comprise silicon dioxide, silicon nitride, some high-k dielectric (e.g., a dielectric having a greater dielectric constant than silicon dioxide), or some other suitable material. In some embodiments, the first gate electrode 114, the first capacitor electrode 126, and the second capacitor electrode 136 comprise polysilicon or some other suitable material.

Figure 2:
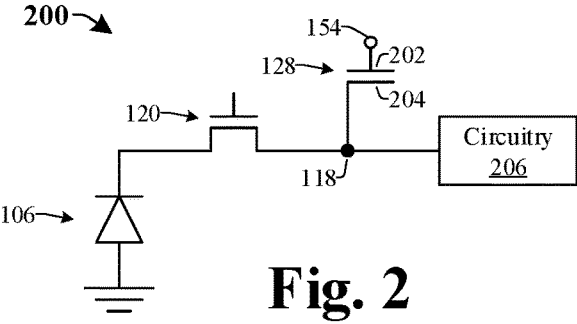
FIG. 2 illustrates a circuit diagram of some embodiments of the integrated chip of FIG. 1.

FIG. 2 illustrates a circuit diagram 200 of some embodiments of the integrated chip of FIG. 1.

The transfer transistor 120 selectively couples the photodetector 106 to the first floating diffusion region 118. The first electrode 202 of the semiconductor capacitor 128 is coupled to the bias voltage supply 154. The second electrode 204 of the semiconductor capacitor 128 is coupled to the first floating diffusion region 118. Additional circuitry 206 is coupled to the first floating diffusion region 118. In some embodiments, the additional circuitry 206 comprises additional transistors such as pixel transistors (e.g., a reset transistor, a source follower transistor, a select transistor, or the like), additional capacitors, or some other suitable circuitry.

7

Figure 3:
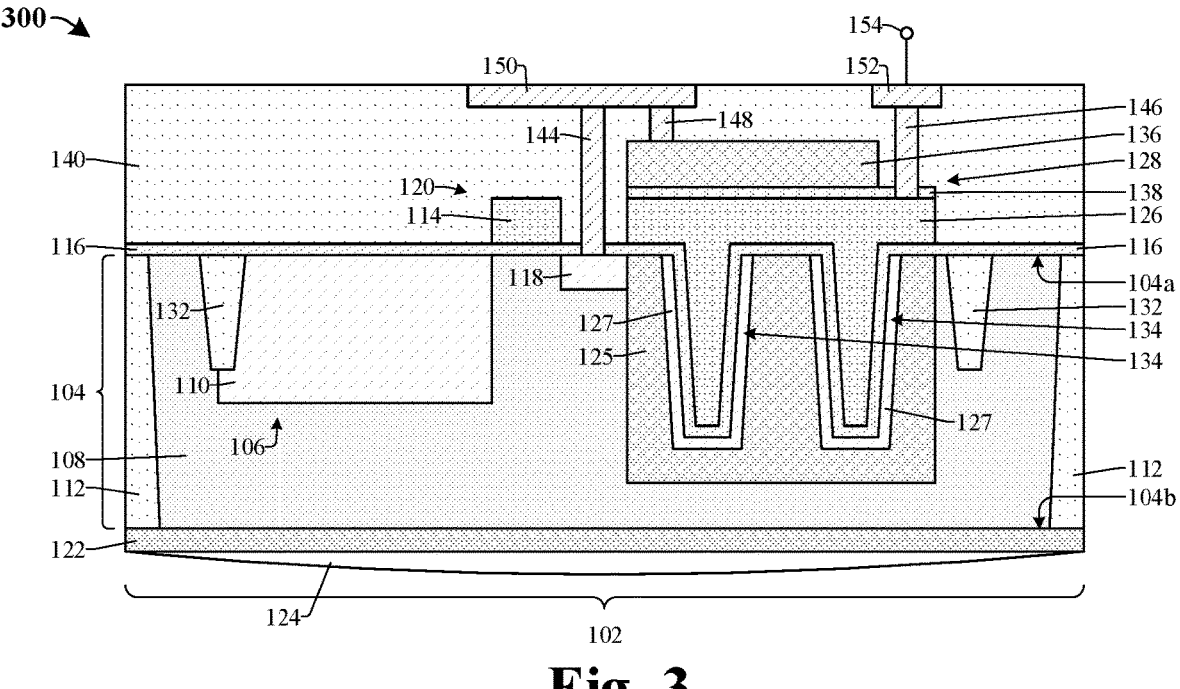
FIG. 3 illustrates a cross-sectional view of some other embodiments of an integrated chip including a pixel along a semiconductor substrate and a semiconductor capacitor along the pixel.

FIG. 3 illustrates a cross-sectional view 300 of some other embodiments of an integrated chip including a pixel 102 along a semiconductor substrate 104 and a semiconductor capacitor 128 along the pixel 102.

In some embodiments, the photodiode implant region 110 is arranged along the first side 104a of the substrate 104 and does not extend directly under the semiconductor capacitor 128. Further, a bottom surface of the first gate electrode 114 is over and spaced from the first side 104a of the substrate 104.

In some embodiments, the depth of the capacitor trenches 134 is greater than the depth of the shallow trench isolation layer 132. Thus, the bottom surfaces of the first capacitor electrode 126 are below the bottom surfaces of the shallow trench isolation layer 132. By increasing the depth of the capacitor trenches 134, the area between the capacitor implant region 125 (e.g., the second electrode of the semiconductor capacitor 128) and the first capacitor electrode 126 (e.g., the first electrode of the semiconductor capacitor 128) can be further increased and hence the capacitance of the semiconductor capacitor 128 can be further increased without increasing the lateral area of the semiconductor capacitor 128.

Figure 4:
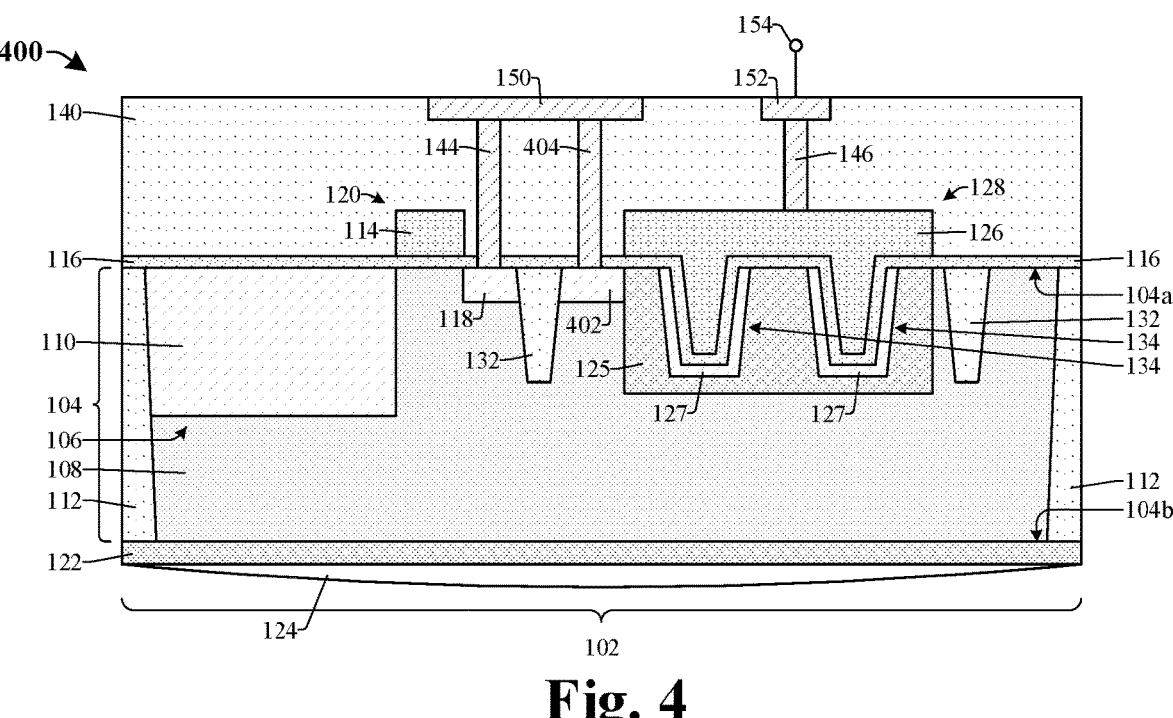
FIG. 4 and FIG. 5 illustrate cross-sectional views of various other embodiments of an integrated chip including a pixel along a semiconductor substrate and a semiconductor capacitor along the pixel.
Figure 5:
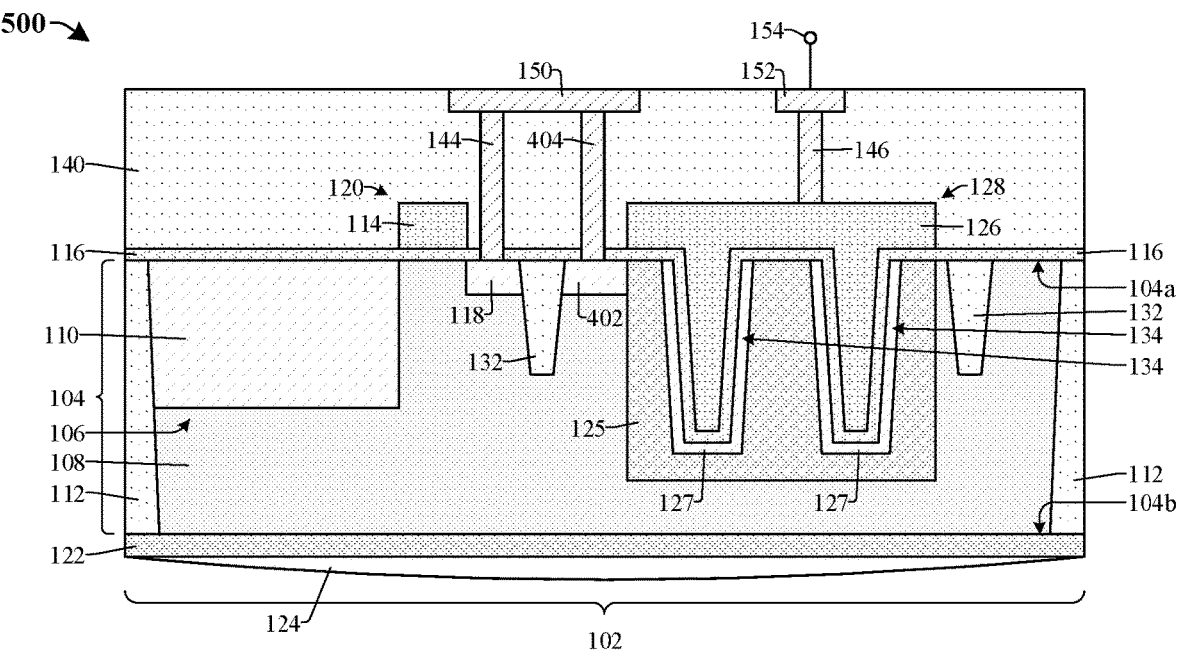

FIG. 4 illustrates a cross-sectional view 400 and FIG. 5 illustrates a cross-sectional view 500 of various other embodiments of an integrated chip including a pixel 102 along a semiconductor substrate 104 and a semiconductor capacitor 128 along the pixel 102.

In some embodiments, the semiconductor capacitor 128 is devoid of the second insulator layer (e.g., second insulator layer 138 of FIG. 1 and FIG. 3) and the second capacitor electrode (e.g., second capacitor electrode 136 of FIG. 1 and FIG. 3). The dielectric structure 140 (e.g., a dielectric layer of the dielectric structure 140) covers a top surface of the first capacitor electrode 126.

In some embodiments, the substrate 104 further comprises another implant region 402 along the first side 104a of the substrate 104 and adjacent to the capacitor implant region 125. Implant region 402 has the second doping type. In some embodiments, the shallow trench isolation layer 132 is directly between implant region 402 and the first floating diffusion region 118.

Implant region 402 is coupled to the first floating diffusion region 118. For example, a conductive contact 404 is on and coupled to implant region 402. Further, contact 144 and contact 404 are coupled together by conductive line 150.

Figure 6:
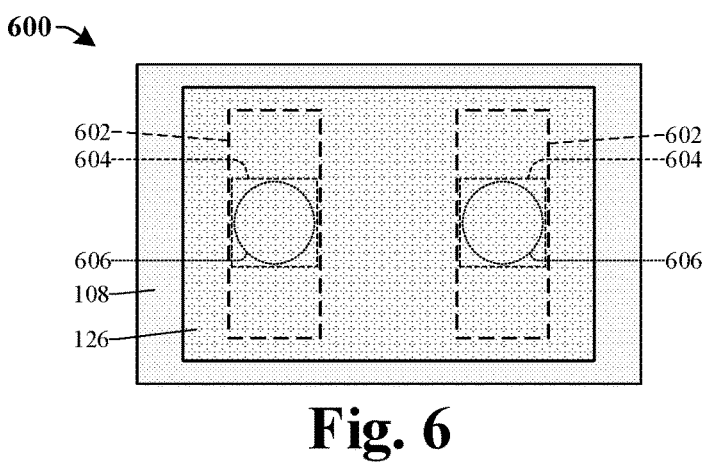
FIG. 6 illustrates a top view of some embodiments of the integrated chips of FIG. 4 and FIG. 5.

FIG. 6 illustrates a top view 600 of some embodiments of the first capacitor electrode 126 of FIG. 4 and FIG. 5.

The first capacitor electrode 126 has a lateral region (e.g., a planar region) extending over the first side 104a of the substrate 104. The first capacitor electrode 126 further has one or more vertical regions extending from the lateral region to below the first side 104a of the substrate 104 and into the capacitor trenches 134. In some embodiments, the capacitor trenches 134 and the vertical region(s) of the first capacitor electrode 126 have elongated trench shapes, as illustrated by dashed lines 602. In some other embodiments, the capacitor trenches 134 and the vertical region(s) of the first capacitor electrode 126 have square-like shapes, as illustrated by dashed lines 604. In some other embodiments, the capacitor trenches 134 and the vertical region(s) of the first capacitor electrode 126 have round shapes, as illustrated by dashed lines 606.

Figure 7:
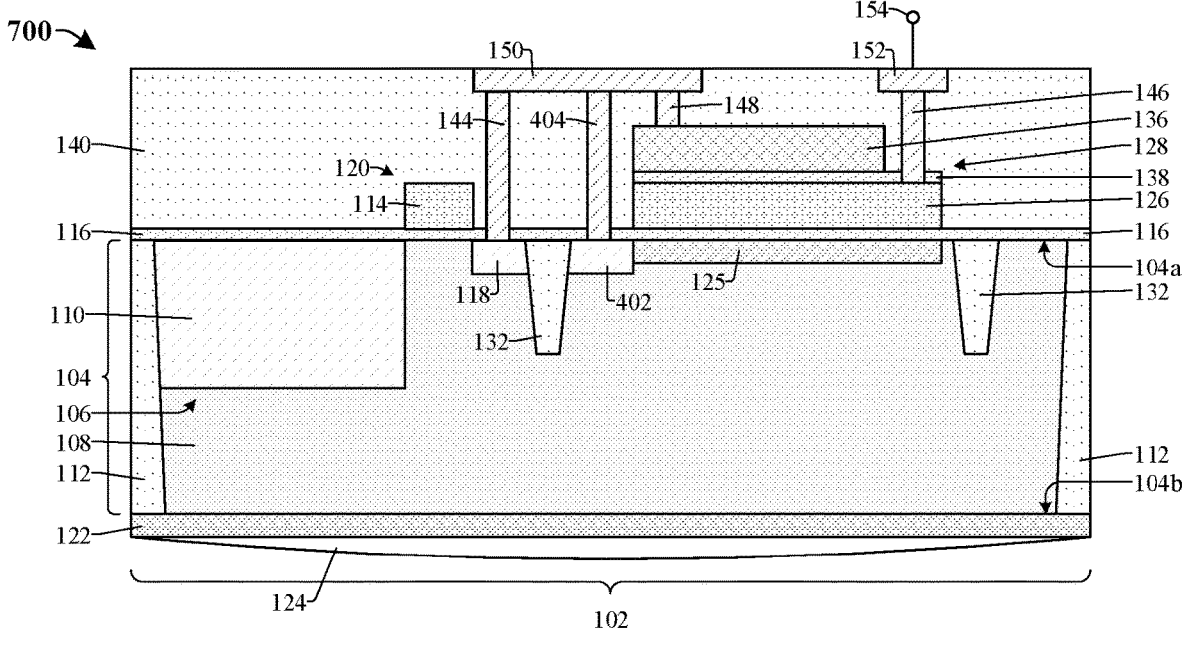
FIG. 7 and FIG. 8 illustrate cross-sectional views of various other embodiments of an integrated chip including a pixel along a semiconductor substrate and a semiconductor capacitor along the pixel.
Figure 8:
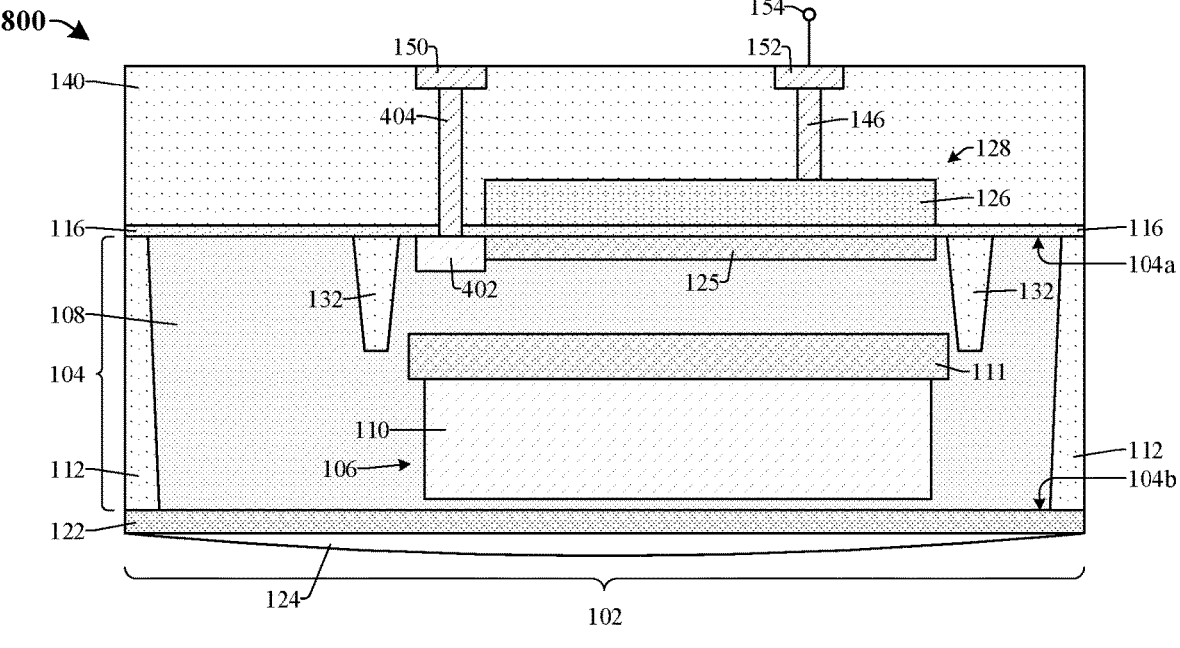

FIG. 7 illustrates a cross-sectional view 700 and FIG. 8 illustrates a cross-sectional view 800 of various other embodiments of an integrated chip including a pixel 102 along a semiconductor substrate 104 and a semiconductor capacitor 128 along the pixel 102.

In some embodiments, the first capacitor electrode 126 does not extend below the first side 104a of the substrate 104. For example, a bottommost surface of the first capacitor electrode 126 is over and spaced from the first side 104a of the substrate 104. In some embodiments, the bottommost surface of the first capacitor electrode 126 is substantially planar between outermost sidewalls of the first capacitor electrode 126.

The first gate electrode 114 and the first floating diffusion region 118 are not shown in FIG. 8 because in some embodiments, the transfer gate and the first floating diffusion region 118 are spaced apart (e.g., into the page) from semiconductor capacitor 128.

Figure 9:
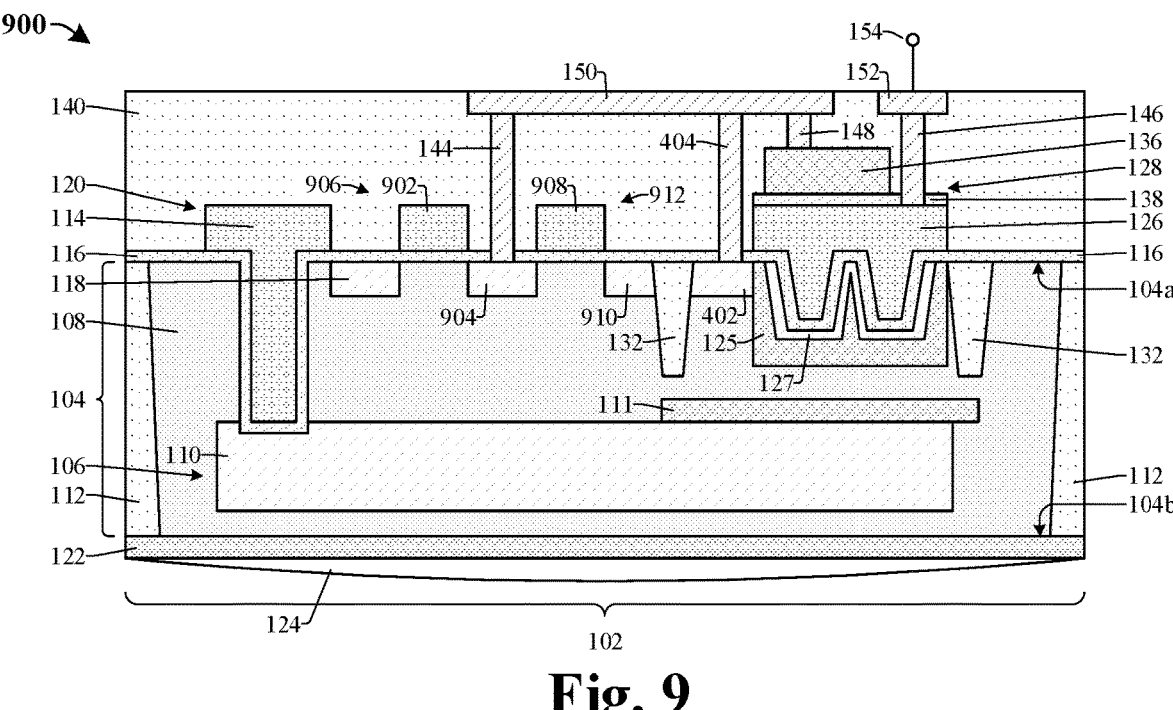
FIG. 9 illustrates a cross-sectional view of some embodiments of the integrated chip of FIG. 1 in which a transistor is arranged between a transfer transistor and the semiconductor capacitor.
Figure 10:
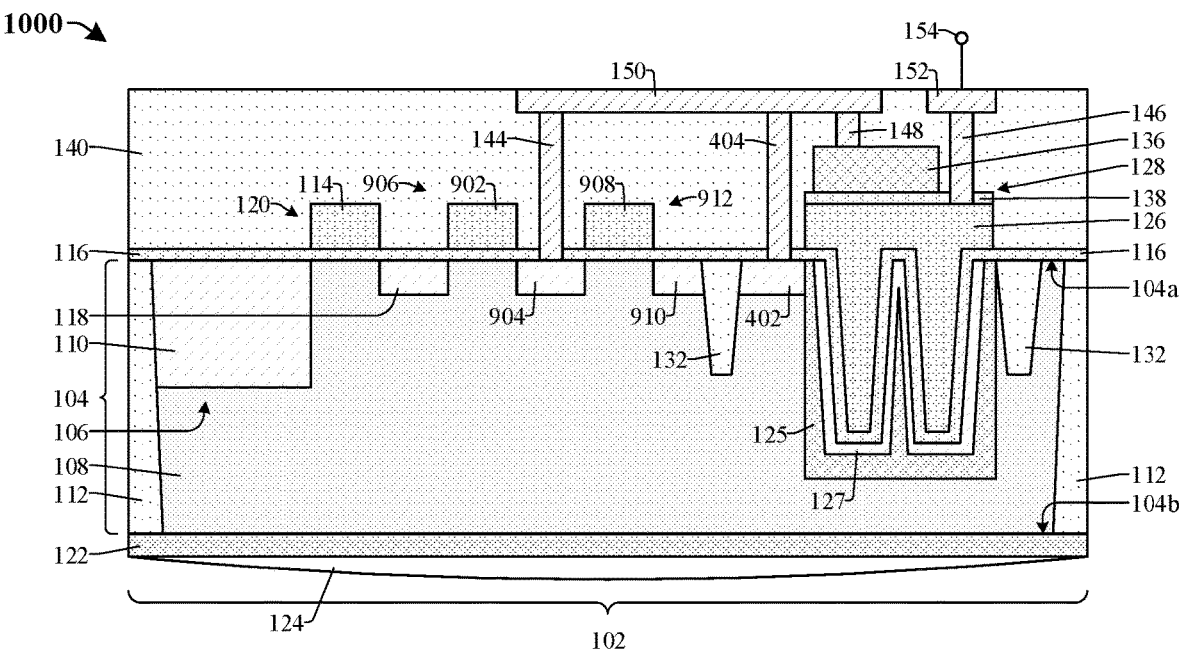
FIG. 10 illustrates a cross-sectional view of some embodiments of the integrated chip of FIG. 3 in which a transistor is arranged between the transfer transistor and the semiconductor capacitor.

FIG. 9 illustrates a cross-sectional view 900 and FIG. 10 illustrates a cross-sectional view 1000 of some embodiments of the integrated chip of FIG. 1 and FIG. 3, respectively, in which a transistor 906 is arranged between the transfer transistor 120 and the semiconductor capacitor 128.

A second gate electrode 902 is over the first side 104a of the substrate 104 and laterally spaced from the first gate electrode 114. The first insulator layer 116 is directly between the second gate electrode 902 and the substrate 104.

The substrate 104 further comprises a second floating diffusion region 904 along the first side 104a of the substrate 104 and laterally spaced from the first floating diffusion region 118. The second floating diffusion region 904 has the second doping type. The second gate electrode 902 is between the first floating diffusion region 118 and the second floating diffusion region 904. Contact 144 is on the second floating diffusion region 904 and couples the second electrode of the semiconductor capacitor 128 (e.g., capacitor implant region 125) to the second floating diffusion region 904.

The first floating diffusion region 118, the second floating diffusion region 904, the bulk region 108, the second gate electrode 902, and the first insulator layer 116 form a transistor 906. For example, the first floating diffusion region 118 forms a first source/drain region, the second floating diffusion region 904 forms a second source/drain region, the bulk region 108 forms a channel region, the second gate electrode 902 forms a capacitor gate, and the first insulator layer 116 forms a gate dielectric layer.

A third gate electrode 908 is over the first side 104a of the substrate 104 and laterally spaced from the second gate electrode 902. The first insulator layer 116 is directly between the third gate electrode 908 and the substrate 104.

The substrate 104 further comprises another implant region 910 along the first side 104a of the substrate 104 and laterally spaced from the second floating diffusion region 904. Implant region 910 has the second doping type. The third gate electrode 908 is between the second floating diffusion region 904 and implant region 910. In some embodiments, implant region 910 is coupled to a voltage supply (e.g., voltage supply 1108 of FIG. 11A) by a conductive contact (not shown) and a conductive line (not shown).

The second floating diffusion region 904, implant region 910, the bulk region 108, the third gate electrode 908, and the first insulator layer 116 form a first pixel transistor 912 (e.g., a reset transistor). For example, the second floating diffusion region 904 forms a first source/drain region, implant region 910 forms a second source/drain region, the bulk region 108 forms a channel region, the third gate electrode 908 forms a gate, and the first insulator layer 116 forms a gate dielectric layer.

In some embodiments, the substrate 104 further comprises a body implant region (not shown) for biasing the bulk region 108. The body implant region has the first doping type. In some embodiments, the body implant region is coupled to ground.

In some embodiments, additional pixel transistors (not shown) are disposed along substrate 104. For example, a source follower transistor (e.g., 1102 of FIGS. 11A and 11B) and a select transistor (e.g., 1104 of FIGS. 11A and 11B) are disposed along the substrate 104. In some embodiments, a second semiconductor capacitor (e.g., second semiconductor capacitor 1110 of FIGS. 11A and 11B) is disposed along the substrate 104.

Figure 11A:
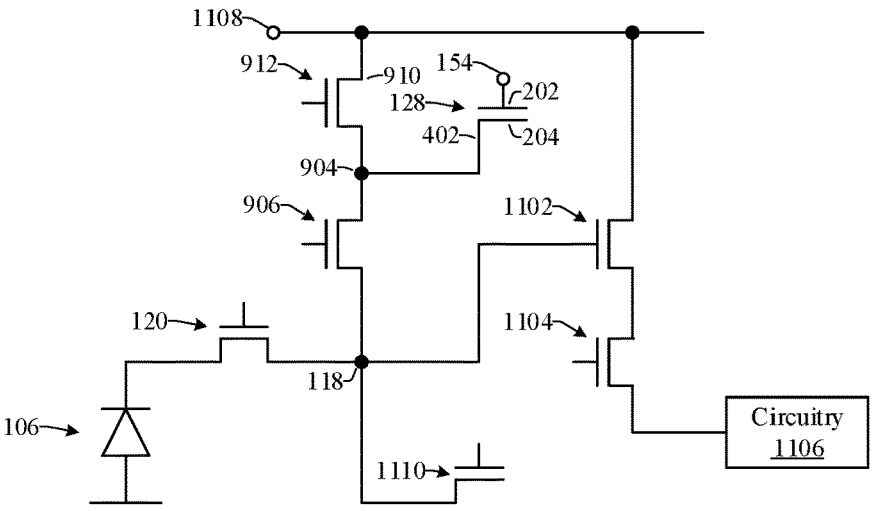
FIGS. 11A and 11B illustrate circuit diagrams of some embodiments of the integrated chip of FIG. 9 and/or FIG. 10.
Figure 11B:
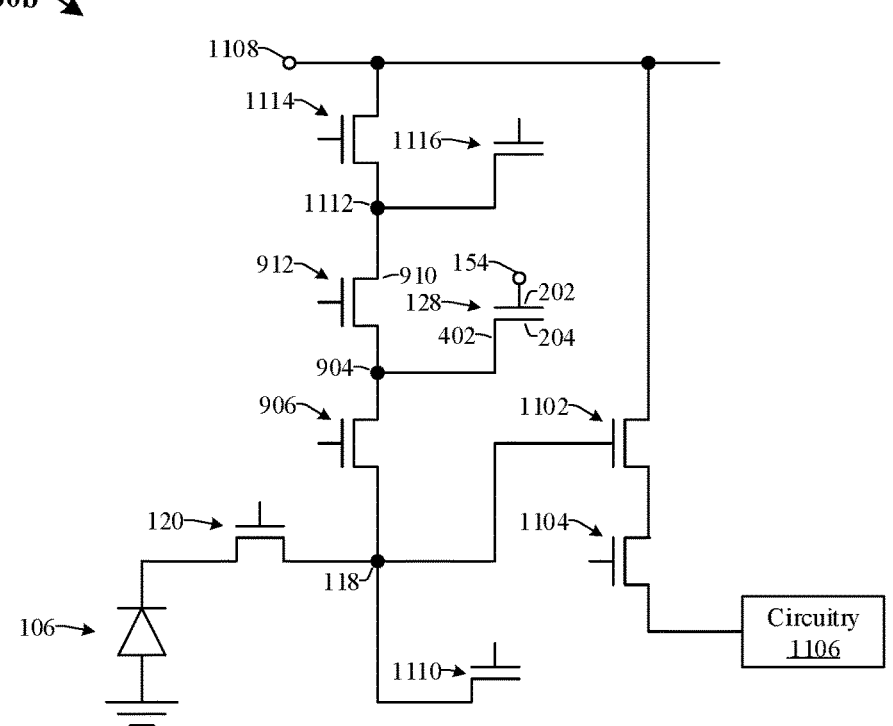

FIG. 11A illustrates a circuit diagram 1100a of some embodiments of the integrated chip of FIG. 9 and/or FIG. 10. FIG. 11B illustrates a circuit diagram 1100b of some other embodiments of the integrated chip of FIG. 9 and/or FIG. 10.

Transistor 906 selectively couples the second floating diffusion region 904 and the second electrode 204 of the semiconductor capacitor 128 to the first floating diffusion region 118. A gate of a second pixel transistor 1102 (e.g., a source follower transistor) is coupled to the first floating diffusion region 118. A third pixel transistor 1104 (e.g., a select transistor) is coupled to the second pixel transistor 1102. In some embodiments, a second semiconductor capacitor 1110 is coupled to the first floating diffusion region 118. In some embodiments, additional circuitry 1106 (e.g., an application specific integrated circuit (ASIC) or the like) is coupled to the third pixel transistor 1104.

In some embodiments (e.g., as illustrated in FIG. 11A), the first pixel transistor 912 selectively couples the second floating diffusion region 904 to the voltage supply 1108. In some embodiments (e.g., as illustrated in FIG. 11B), the integrated chip further comprises a third floating diffusion region 1112, a transistor 1114, and a third semiconductor capacitor 1116. Implant region 910 and one electrode of the third semiconductor capacitor 1116 are coupled to the third floating diffusion region 1112. Transistor 1114 selectively couples the third floating diffusion region 1112 to the voltage supply 1108.

In some embodiments, the circuit may be referred to as a multiple conversion gain (MCG) circuit, a dual conversion gain (DCG) circuit, or a lateral overflow integrated capacitor (LOFIC) circuit, or a combination of the foregoing. The second gate electrode 902 may be referred to as a DCG gate, a MCG gate, or a LOFIC gate. The semiconductor capacitor 128 may be referred to as a DCG capacitor, a MCG capacitor, or a LOFIC capacitor. In some embodiments, the semiconductor capacitor 128 can be used to adjust the gain in the MCG or DCG circuits. In some other embodiments, the semiconductor capacitor 128 can be used as voltage domain storage in the LOFIC circuit.

Figure 12:
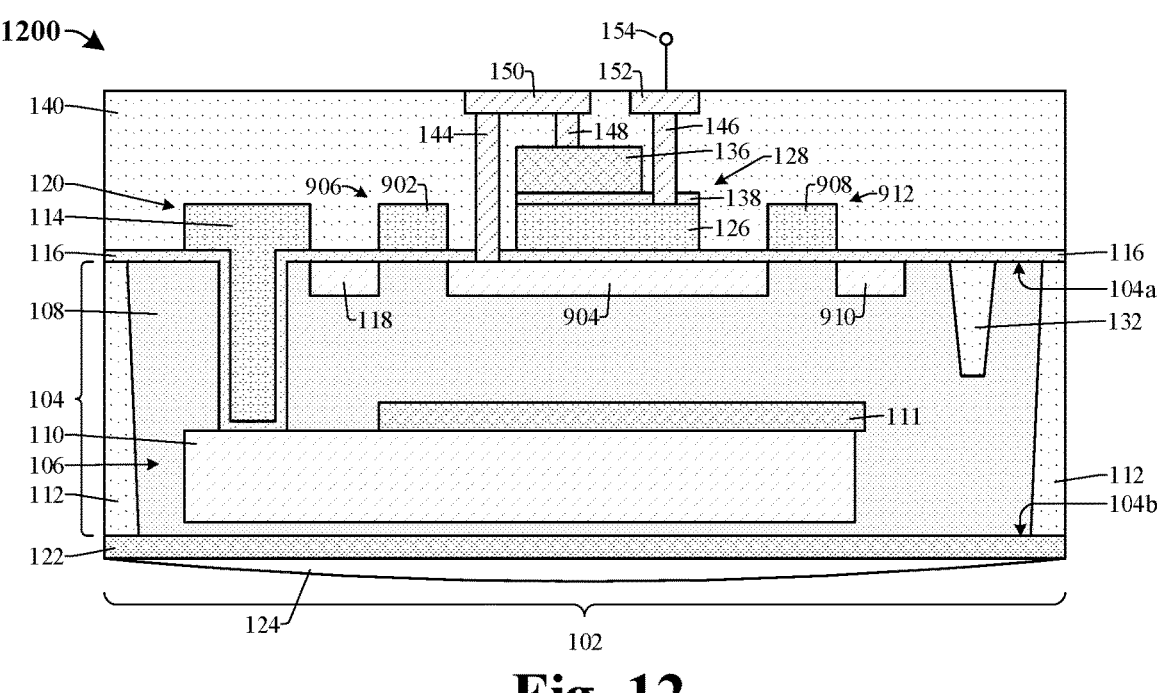
FIG. 12 illustrates a cross-sectional view of some other embodiments of the integrated chip of FIG. 9.
Figure 13:
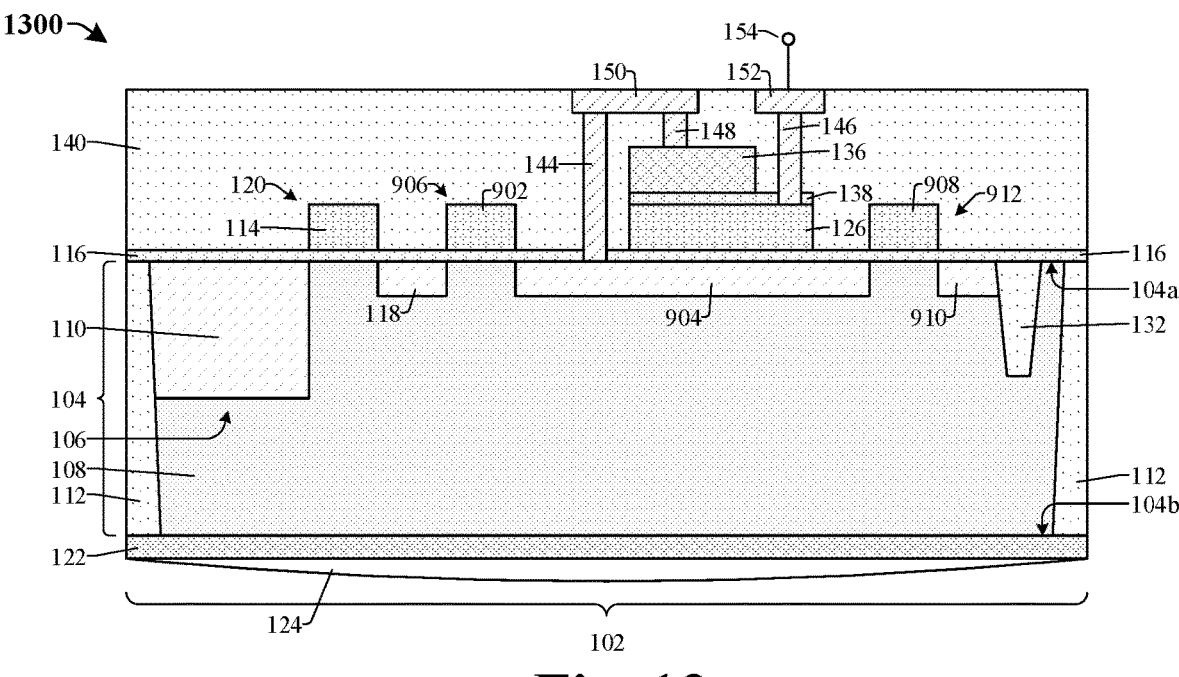
FIG. 13 illustrates a cross-sectional view of some other embodiments of the integrated chip of FIG. 10.

FIG. 12 illustrates a cross-sectional view 1200 and FIG. 13 illustrates a cross-sectional view 1300 of some embodiments of the integrated chip of FIG. 9 and FIG. 10, respectively, in which the first capacitor electrode 126 is disposed directly over the second floating diffusion region 904.

The second floating diffusion region 904 and the second capacitor electrode 136 form the second electrode of the semiconductor capacitor 128. The first capacitor electrode 126 is directly between the second gate electrode 902 and the third gate electrode 908. Contact 144 is coupled to the second floating diffusion region 904 beside the first capacitor electrode 126.

Figure 14:
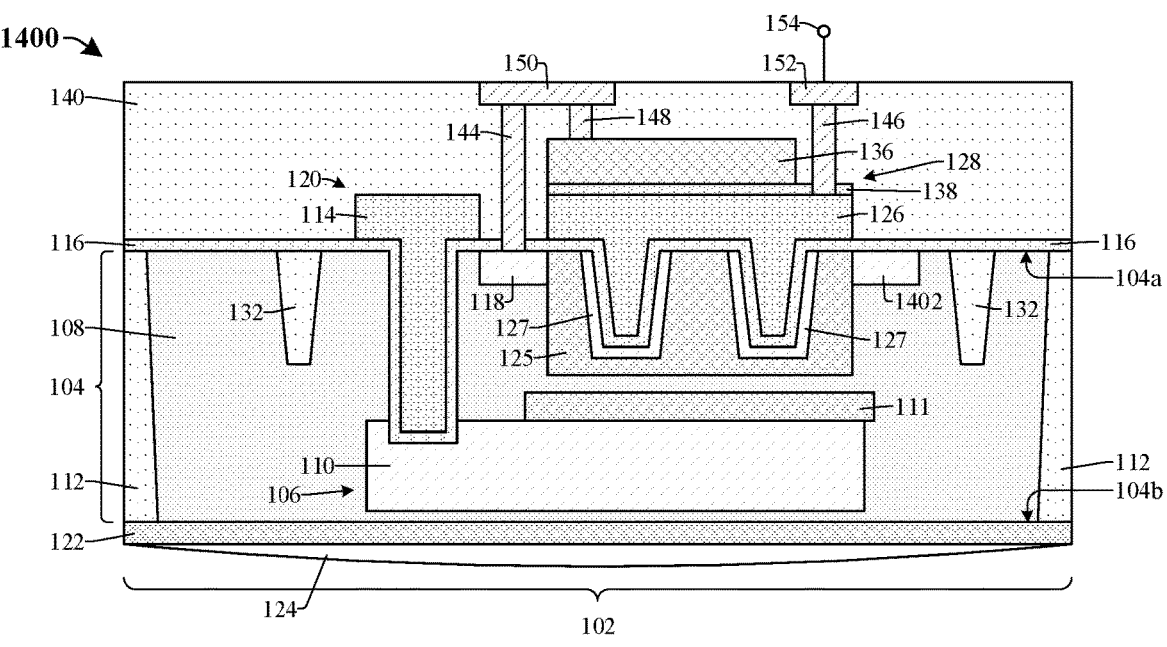
FIG. 14 illustrates a cross-sectional view of some embodiments of the integrated chips of FIG. 1 in which the semiconductor capacitor is a capacitor and a transistor.
Figure 15:
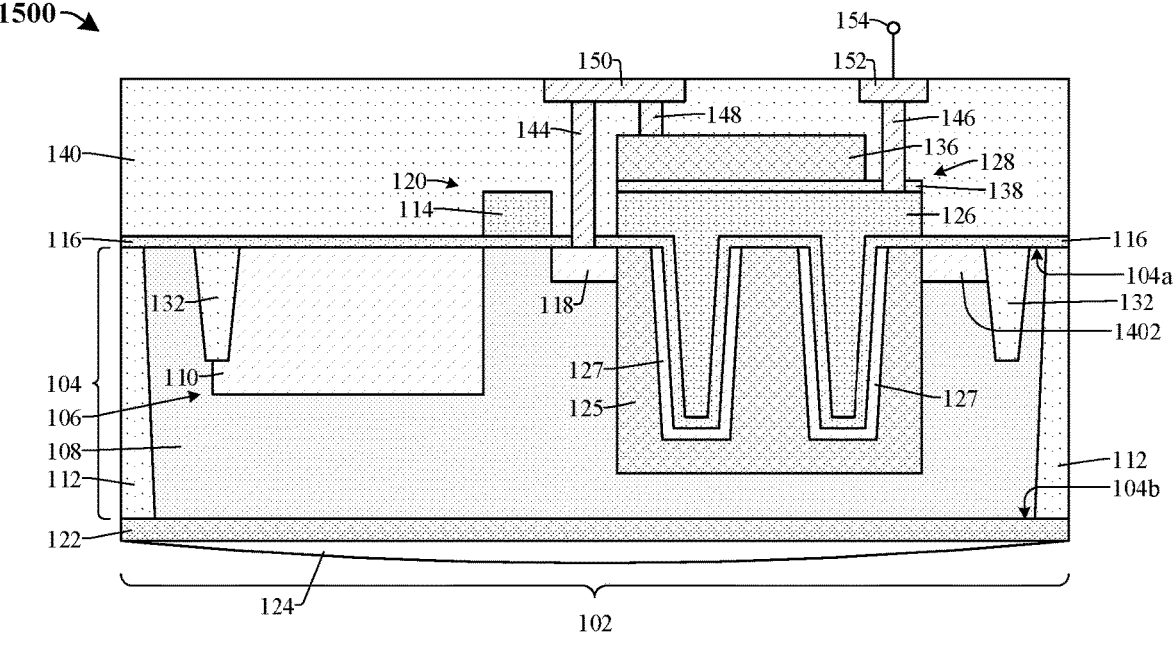
FIG. 15 illustrates a cross-sectional view of some embodiments of the integrated chips of FIG. 3 in which the semiconductor capacitor is a capacitor and a transistor.
Figure 16A:
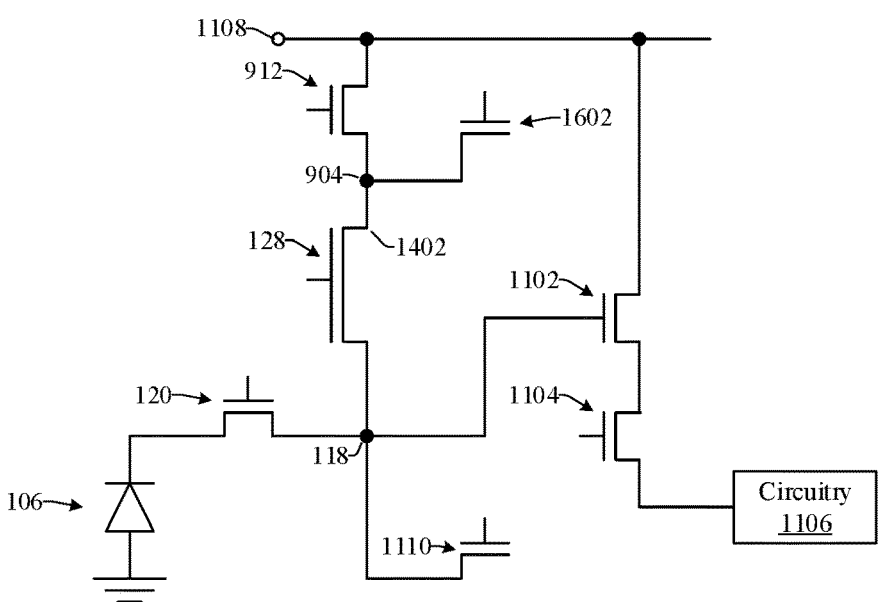
FIG. 16A illustrates a circuit diagram of some embodiments of the integrated chip of FIG. 14 and/or FIG. 15.

FIG. 14 illustrates a cross-sectional view 1400 and FIG. 15 illustrates a cross-sectional view 1500 of some embodiments of the integrated chips of FIG. 1 and FIG. 3, respectively, in which the semiconductor capacitor 128 is a capacitor and a transistor. FIG. 16A illustrates a circuit diagram 1600a of some embodiments of the integrated chip of FIG. 14 and/or FIG. 15.

The substrate 104 comprises another implant region 1402 along the first side 104a of the substrate 104 and adjacent to the capacitor implant region 125. The first capacitor electrode 126 forms a gate, the first insulator layer 116 forms a gate dielectric, the first floating diffusion region 118 forms a first source/drain, implant region 1402 forms a second source/drain, and the capacitor implant region 125 forms a channel. By controlling a bias voltage at the first capacitor electrode 126, the first floating diffusion region 118 can be selectively coupled to implant region 1402 by the capacitor implant region 125.

In some embodiments, the semiconductor capacitor/transistor 128 is coupled between the first floating diffusion region 118 and the second floating diffusion region 904. For example, implant region 1402 is coupled to the second floating diffusion region 904. Further, a capacitor 1602 is coupled to implant region 1402 and the second floating diffusion region 904.

Figure 16B:
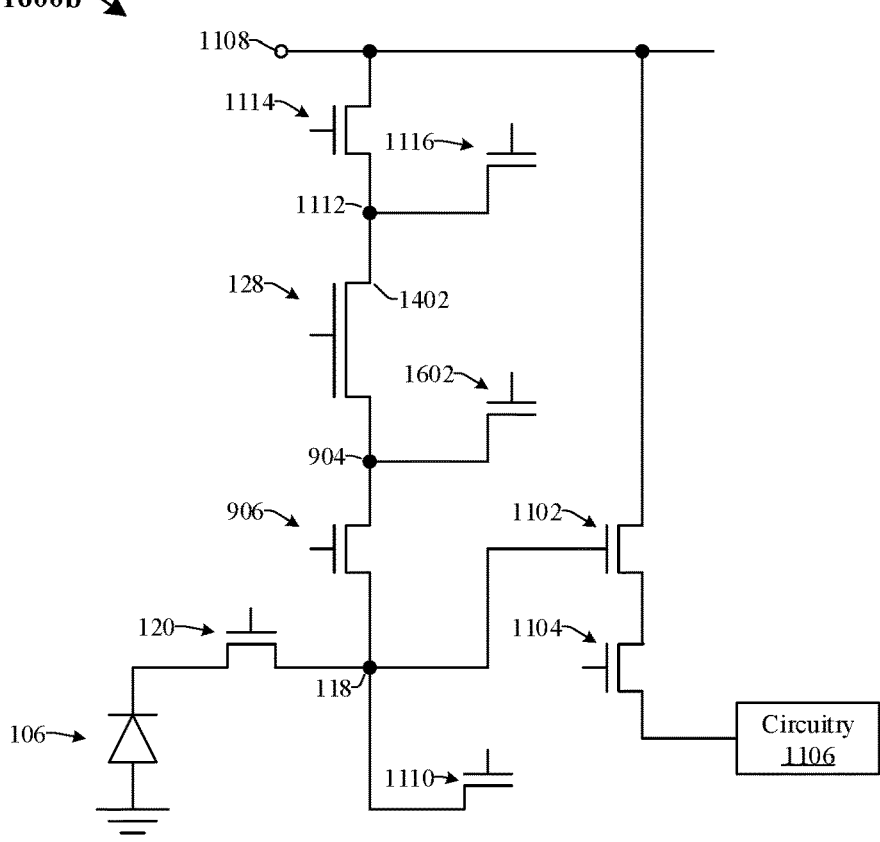
FIG. 16B illustrates a circuit diagram of some other embodiments of the circuits of FIG. 16A and FIG. 11B.

FIG. 16B illustrates a circuit diagram 1600b of some other embodiments of the circuits of FIG. 16A and FIG. 11B.

Transistor 906 is coupled between the first floating diffusion region 118 and the second floating diffusion region 904. Capacitor 1602 is coupled to the second floating diffusion region 904. The semiconductor capacitor/transistor 128 is coupled between the second floating diffusion region 904 and the third floating diffusion region 1112. Capacitor 1116 is coupled to the third floating diffusion region 1112. Transistor 1114 is coupled between the third floating diffusion region 1112 and the voltage supply 1108.

FIGS. 17-31 illustrate cross-sectional views 1700-3100 of some embodiments of a method for forming an integrated chip including a pixel 102 along a semiconductor substrate 104 and a semiconductor capacitor 128 along the pixel 102. Although FIGS. 17-31 are described in relation to a method, it will be appreciated that the structures disclosed in FIGS. 17-31 are not limited to such a method, but instead may stand alone as structures independent of the method.

Figure 17:
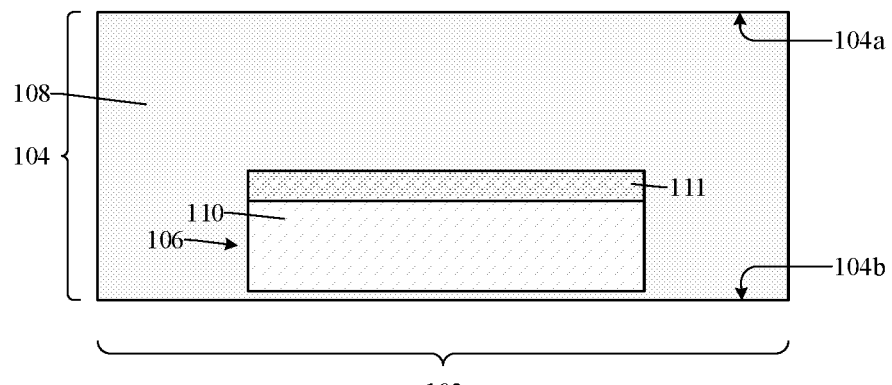
FIGS. 17-31 illustrate cross-sectional views of some embodiments of a method for forming an integrated chip including a pixel along a semiconductor substrate and a semiconductor capacitor along the pixel.

As shown in cross-sectional view 1700 of FIG. 17, a photodetector 106 is formed in a semiconductor substrate 104. For example, the substrate 104 comprises a bulk region 108 having a first doping type (e.g., p-type). A photodiode implant region 110 having a second doping type (e.g., n-type), different than the first doping type, is formed in the substrate 104. The photodetector 106 is formed by the p-n junction between the photodiode implant region 110 and the bulk region 108. In some embodiments, the bulk region 108 may alternatively be referred to as a well implant region.

In some embodiments, the photodiode implant region 110 is formed below a first side 104a of the substrate 104. In some other embodiments (e.g., as shown in FIG. 3), the photodiode implant region 110 is formed along the first side 104a of the substrate 104. In some embodiments, an isolation implant region 111 having the first doping type is formed over the photodiode implant region 110.

In some embodiments, the implant regions 110, 111 are formed by ion implantation processes or some other suitable process. In some embodiments, the semiconductor substrate 104 comprises silicon, germanium, silicon germanium, gallium arsenide, or some other suitable material.

Figure 18:
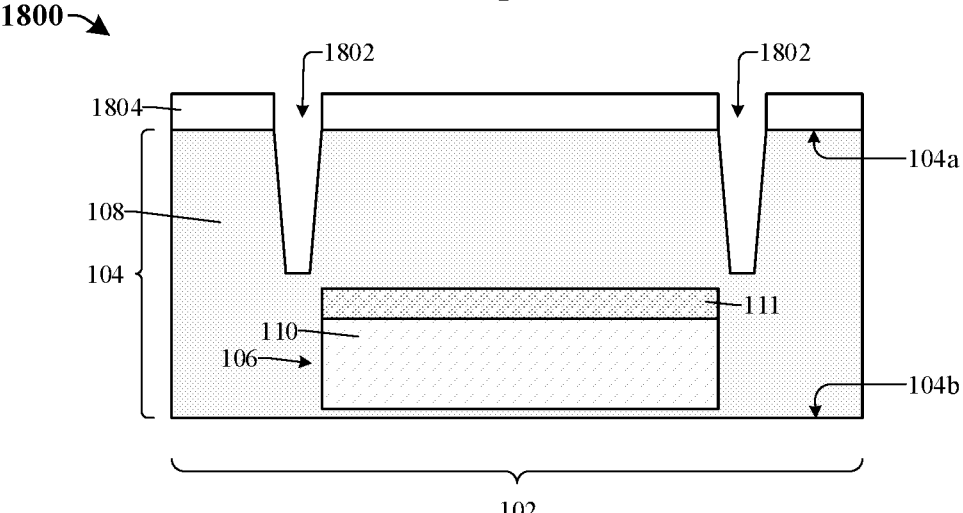

As shown in cross-sectional view 1800 of FIG. 18, the substrate 104 is etched to form a one or more shallow trenches 1802 in the substrate 104 along the first side 104a of the substrate 104. In some embodiments, a masking layer 1804 is formed over the first side 104a of the substrate 104 and the etching is performed according to the masking layer 1804. In some embodiments, the masking layer 1804 comprises a photoresist layer, a hard mask layer, or some other suitable layer. In some embodiments, the masking layer 1804 is removed during and/or after the etching. In some embodiments, the etching comprises a dry etching process (e.g., a plasma etching process, a reactive ion etching process, an ion beam etching process, or the like) or some other suitable process.

Figure 19:
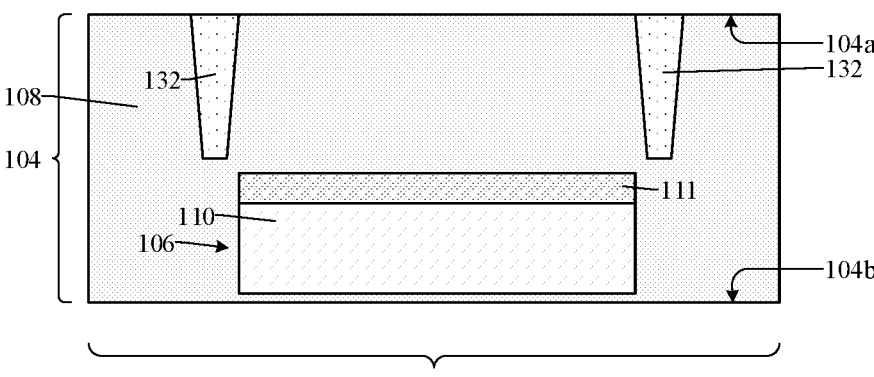

As shown in cross-sectional view 1900 of FIG. 19, a shallow trench isolation layer 132 is deposited in the shallow trench(es) (e.g., 1802 of FIG. 18). In some embodiments, the shallow trench isolation layer 132 comprises silicon dioxide, silicon nitride, or some other suitable material. In some embodiments, the shallow trench isolation layer 132 is deposited by chemical vapor deposition (CVD) process, a physical vapor deposition (PVD) process, an atomic layer deposition (ALD) process, or some other suitable process. In some embodiments, a planarization process (e.g., a chemical mechanical planarization (CMP) or some other suitable process) is subsequently performed on the shallow trench isolation layer 132 to remove the shallow trench isolation layer 132 from over the first side 104a of the substrate 104.

Figure 20:
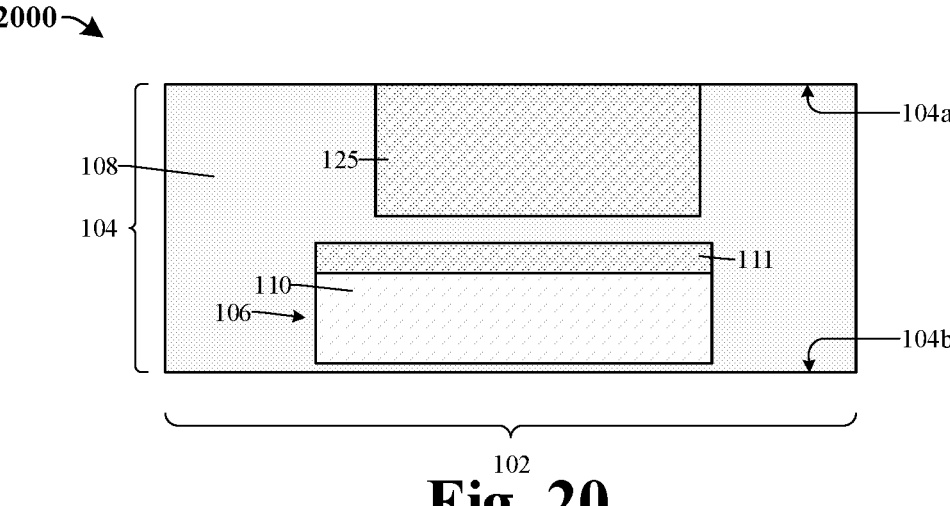

As shown in cross-sectional view 2000 of FIG. 20, a capacitor implant region 125 having the second doping type is formed along the first side 104a of the substrate 104. In some embodiments, the capacitor implant region 125 is formed by an ion implantation process or some other suitable process.

Figure 21:
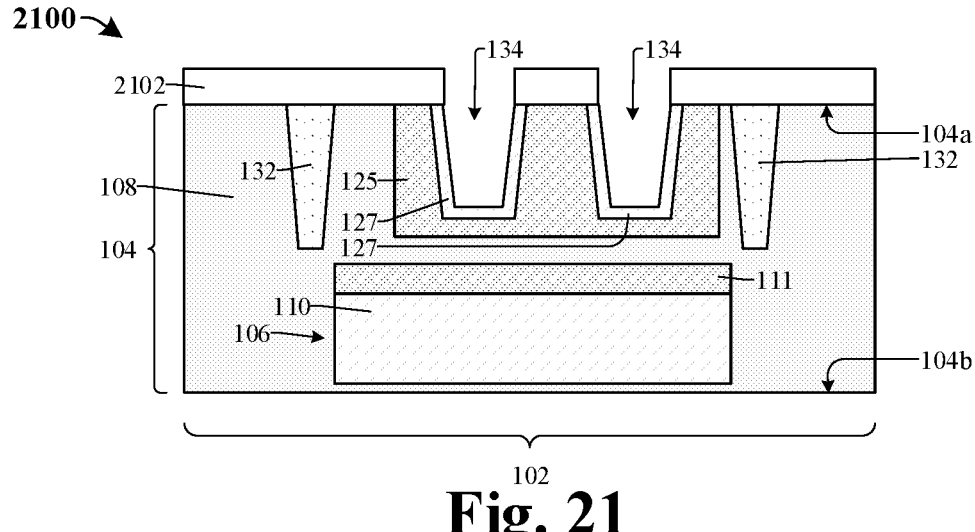

As shown in cross-sectional view 2100 of FIG. 21, in some embodiments, the substrate 104 is etched to form one or more capacitor trenches 134 in the capacitor implant region 125 of the substrate 104. In some embodiments, a masking layer 2102 is formed over the first side 104a of the substrate 104 and the etching is performed according to the masking layer 2102. In some embodiments, the etching comprises a dry etching process or some other suitable process.

In some embodiments, the depth of the capacitor trenches 134 (e.g., the distance between the first side 104a of the substrate 104 and the bottom of the capacitor trenches 134) is approximately equal to or less than the depth of the shallow trench isolation layer 132. In other words, upper surfaces of the substrate 104 that delimit the bottoms of the capacitor trenches 134 are above or at the same depth as bottommost surfaces of the shallow trench isolation layer 132. In some other embodiments, the depth of the capacitor trenches 134 is greater than the depth of the shallow trench isolation layer 132. In other words, the upper surfaces of the substrate 104 that delimit the bottoms of the capacitor trenches 134 are below the bottommost surfaces of the shallow trench isolation layer 132.

In some instances, the etching causes damage (e.g., creates defects) along the surfaces (e.g., sidewalls and upper surfaces) of the substrate 104 that delimit the capacitor trenches 134. Thus, in some embodiments, a protective implant region 127 having the first doping type is formed in the capacitor implant region 125 along the capacitor trenches 134. The protective implant region 127 may isolate (e.g., protect) the capacitor implant region 125 from the damaged surfaces to reduce negative impacts which may be caused by the damaged surfaces. In some embodiments, the protective implant region 127 is formed by an ion implantation process or some other suitable process.

Figure 22:
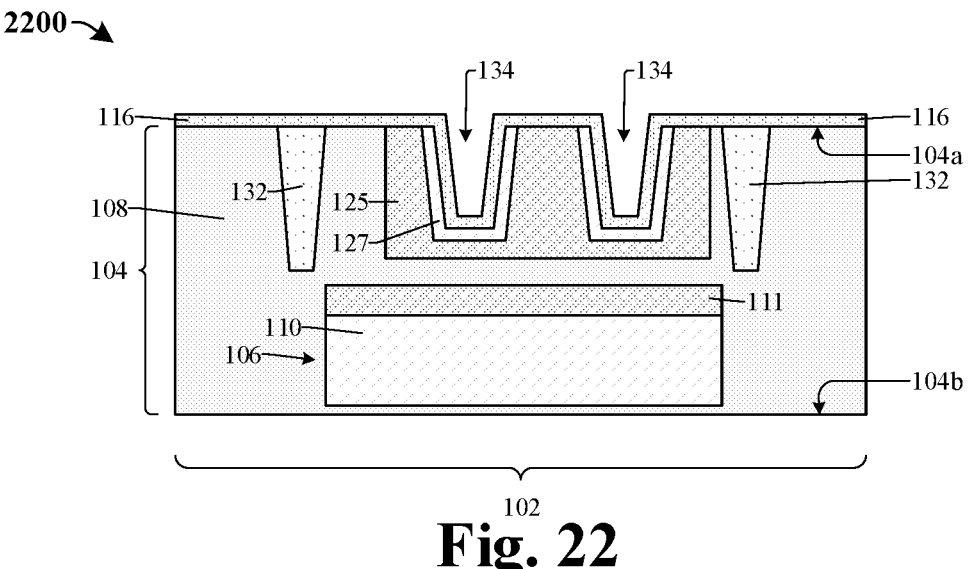

As shown in cross-sectional view 2200 of FIG. 22, a first insulator layer 116 is deposited over the first side 104a of the substrate 104 so that the first insulator layer 116 lines the capacitor trench(es) 134 and the first side 104a of the substrate 104. In some embodiments, the first insulator layer 116 comprises silicon dioxide, silicon nitride, some high-k dielectric (e.g., some dielectric having a greater dielectric constant than silicon dioxide), or some other suitable material. In some embodiments, the first insulator layer 116 is deposited by a CVD process, a PVD process, an ALD process, or some other suitable process.

Figure 23:
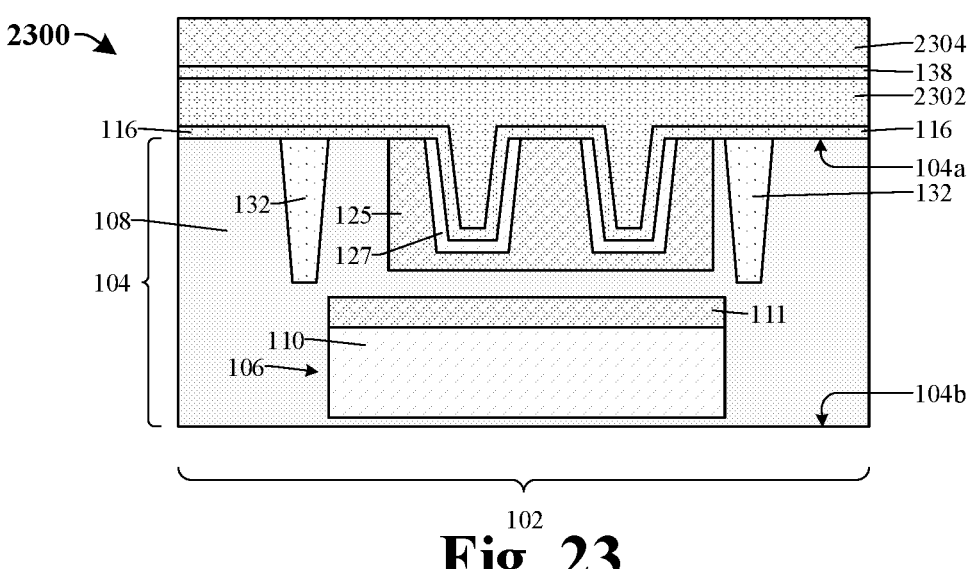

As shown in cross-sectional view 2300 of FIG. 23, a first semiconductor layer 2302 is deposited over the first side 104a of the substrate 104 so that the first semiconductor layer 2302 fills the capacitor trench(es) (e.g., capacitor trenches 134 of FIG. 22). In some embodiments, the first semiconductor layer 2302 comprises polysilicon or some other suitable material. In some embodiments, the first semiconductor layer 2302 is deposited by a CVD process, a PVD process, an ALD process, or some other suitable process.

In some embodiments, a second insulator layer 138 is deposited over the first semiconductor layer 2302 and a second semiconductor layer 2304 is deposited over the second insulator layer 138. In some embodiments, the second insulator layer 138 comprises silicon dioxide, silicon nitride, some high-k dielectric, or some other suitable material. In some embodiments, the second semiconductor layer 2304 comprises polysilicon or some other suitable material. In some embodiments, the second insulator layer 138 and/or the second semiconductor layer 2304 are deposited by CVD processes, PVD processes, ALD processes, or some other suitable processes.

Figure 24:
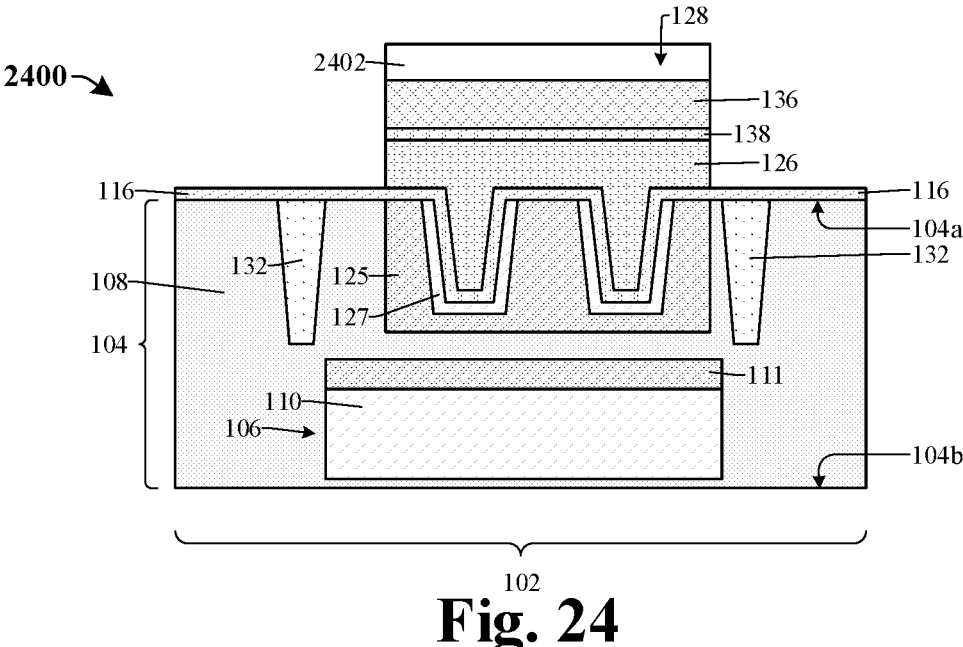

As shown in cross-sectional view 2400 of FIG. 24, the first semiconductor layer 2302, the second insulator layer 138, and the second semiconductor layer 2304 are patterned. The patterning forms a first capacitor electrode 126 from the first semiconductor layer 2302 and a second capacitor electrode 136 from the second semiconductor layer 2304. The second capacitor electrode 136, the second insulator layer 138, the first capacitor electrode 126, the first insulator layer 116, and the capacitor implant region 125 form the semiconductor capacitor 128.

In some embodiments, a masking layer 2402 is formed over the second semiconductor layer 2304 and the etching is performed according to the masking layer 2402. In some embodiments, the etching comprises a dry etching process or some other suitable process.

Figure 25:
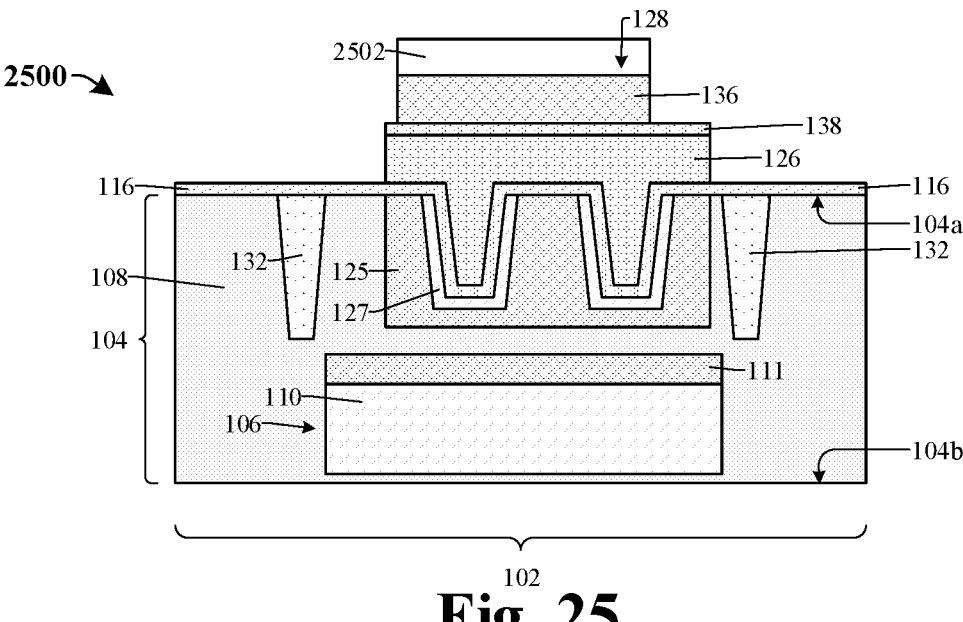

As shown in cross-sectional view 2500 of FIG. 25, the second capacitor electrode 136 is patterned to remove the second capacitor electrode 136 from over a portion of the second insulator layer 138 and a portion of the first capacitor electrode 126. In some embodiments, a masking layer 2502 is formed over the second capacitor electrode 136 and the etching is performed according to the masking layer 2502. In some embodiments, the etching comprises a dry etching process or some other suitable process.

Figure 26:
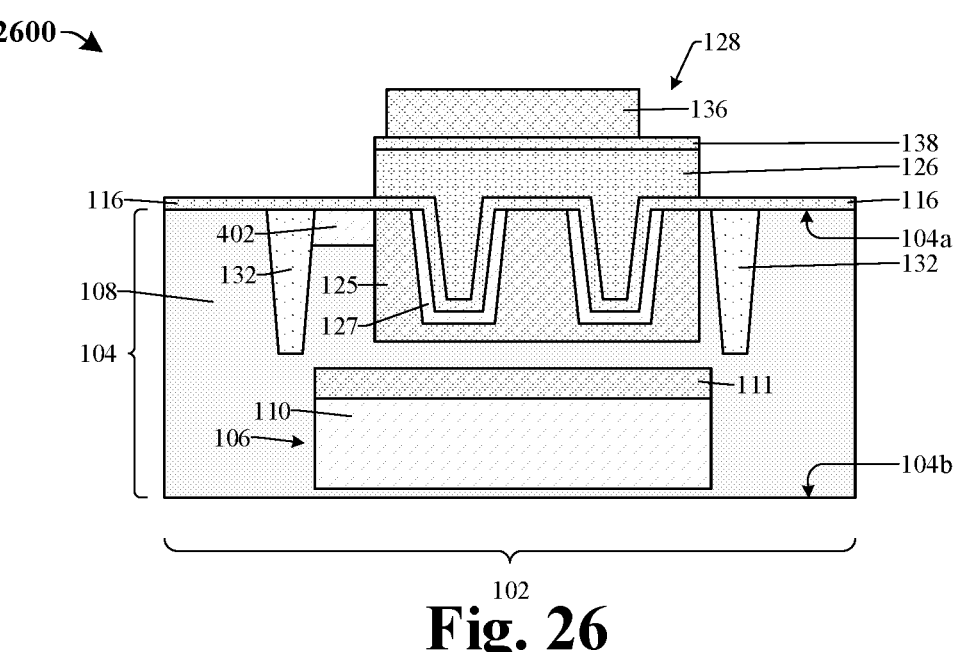

As shown in cross-sectional view 2600 of FIG. 26, an implant region 402 having the second doping type is formed in the substrate 104 along the first side 104a of the substrate 104 and adjacent to the capacitor implant region 125. In some embodiments, the implant region 402 is formed by an ion implantation process or some other suitable process. In some embodiments, another implant region (e.g., implant region 1402 of FIGS. 14 and 15) is formed in the substrate 104 adjacent to the capacitor implant region 125 on the opposite side of the capacitor implant region 125.

Figure 27:
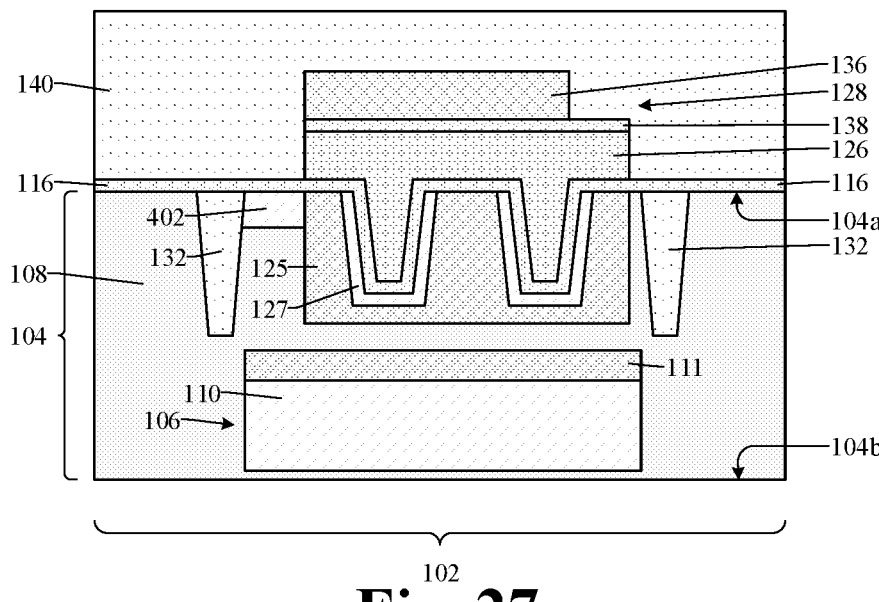

As shown in cross-sectional view 2700 of FIG. 27, a dielectric structure 140 including one or more dielectric layers is deposited over the first side 104a of the substrate 104. In some embodiments, the one or more dielectric layers of the dielectric structure 140 comprise silicon dioxide, silicon nitride, or some other suitable material. In some embodiments, the dielectric structure 140 is deposited by a CVD process, a PVD process, an ALD process, or some other suitable process.

Figure 28:
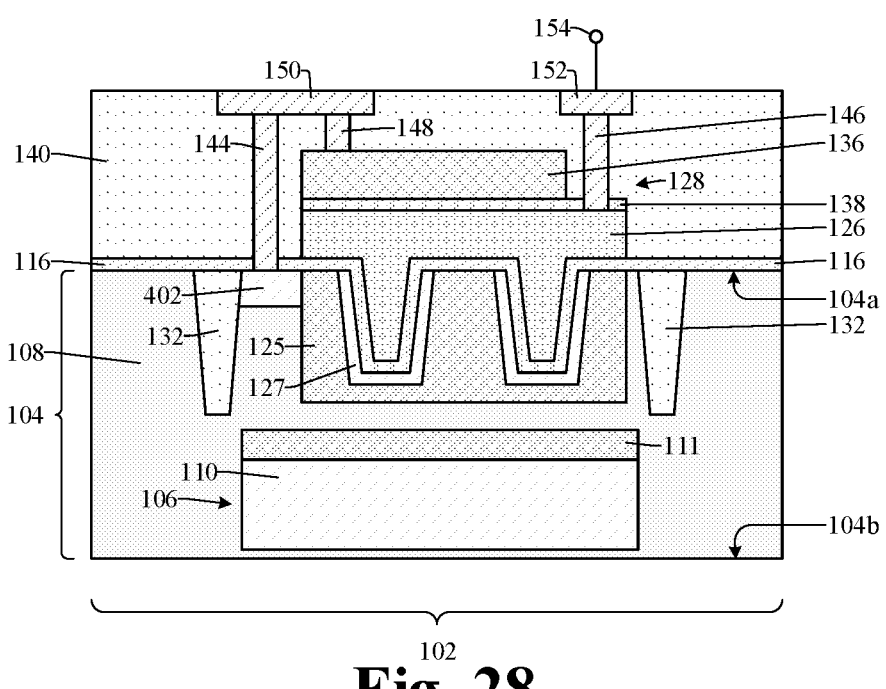

As shown in cross-sectional view 2800 of FIG. 28, a plurality of conductive interconnects (e.g., contacts 144, 146, 148 and lines 150, 152) are formed within the dielectric structure 140. In some embodiments, the interconnects (e.g., contacts 144, 146, 148 and lines 150, 152) are formed by etching the dielectric layer(s) of the dielectric structure 140 and depositing copper, tungsten, aluminum, or some other suitable material over the etched dielectric layer(s) by one or more CVD processes, PVD processes, ALD processes, or some other suitable processes.

Figure 29:
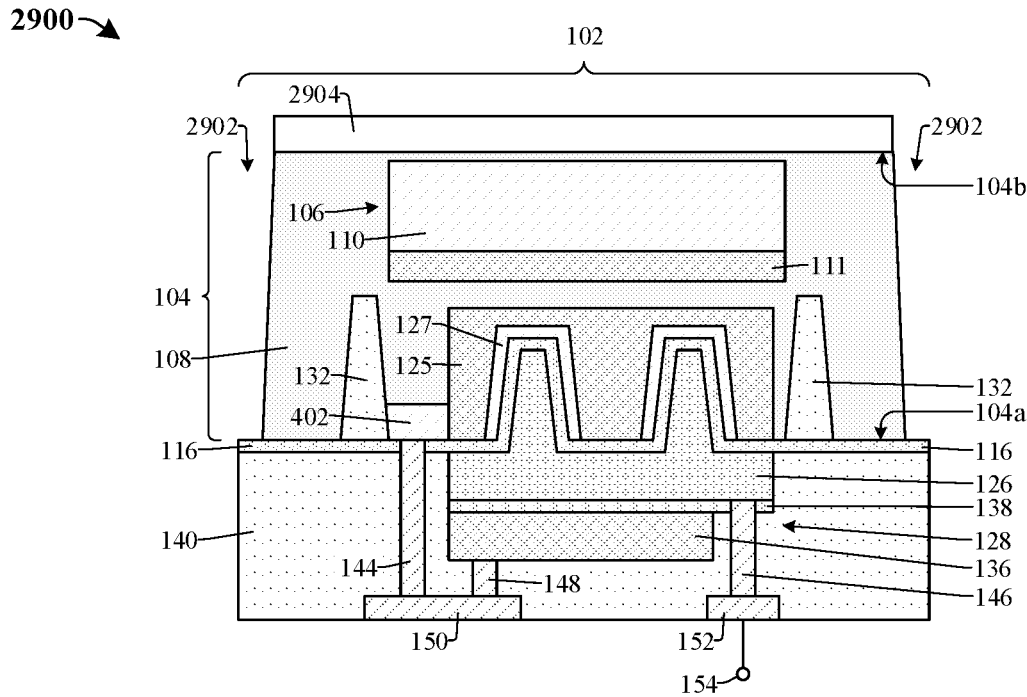

As shown in cross-sectional view 2900 of FIG. 29, a second side 104b of the substrate 104, opposite the first side 104a, is etched to form a deep trench 2902 surrounding the photodetector 106. The deep trench 2902 establishes the boundary of the pixel 102. In some embodiments, the deep trench 2902 extends through the substrate 104 from the second side 104b to the first side 104a. In some other embodiments, the deep trench 2902 extends into the substrate 104 but does not reach the first side 104a. In some embodiments, a masking layer 2904 is formed over second side 104b of the substrate 104 and the etching is performed according to the masking layer 2904. In some embodiments, the etching comprises a dry etching process or some other suitable process.

Figure 30:
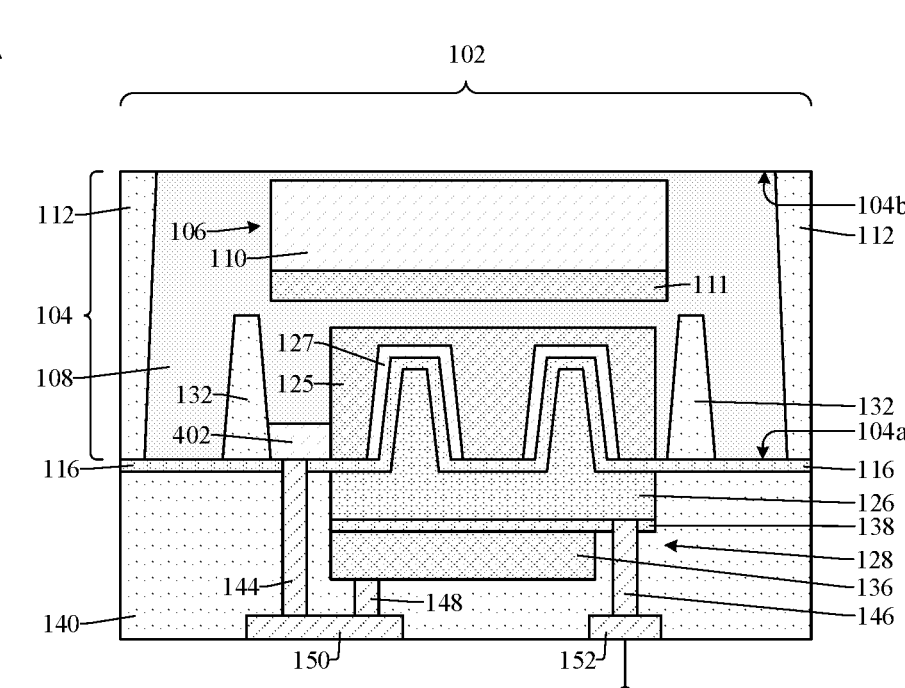

As shown in cross-sectional view 3000 of FIG. 30, a deep trench isolation layer 112 is deposited over the second side 104b of the substrate 104 so the deep trench isolation layer 112 fills the deep trench (e.g., 2902 of FIG. 29). In some embodiments, the deep trench isolation layer 112 comprises silicon dioxide, silicon nitride, or some other suitable material. In some embodiments, the deep trench isolation layer 112 is deposited by a CVD process, a PVD process, an ALD process, or some other suitable process.

In some embodiments, a planarization process (e.g., a CMP or some other suitable process) is subsequently performed on the deep trench isolation layer 112 to remove the deep trench isolation layer 112 from over the second side 104b of the substrate 104. In some other embodiments (not shown), the deep trench isolation layer 112 covers the second side 104b of the substrate 104.

Figure 31:
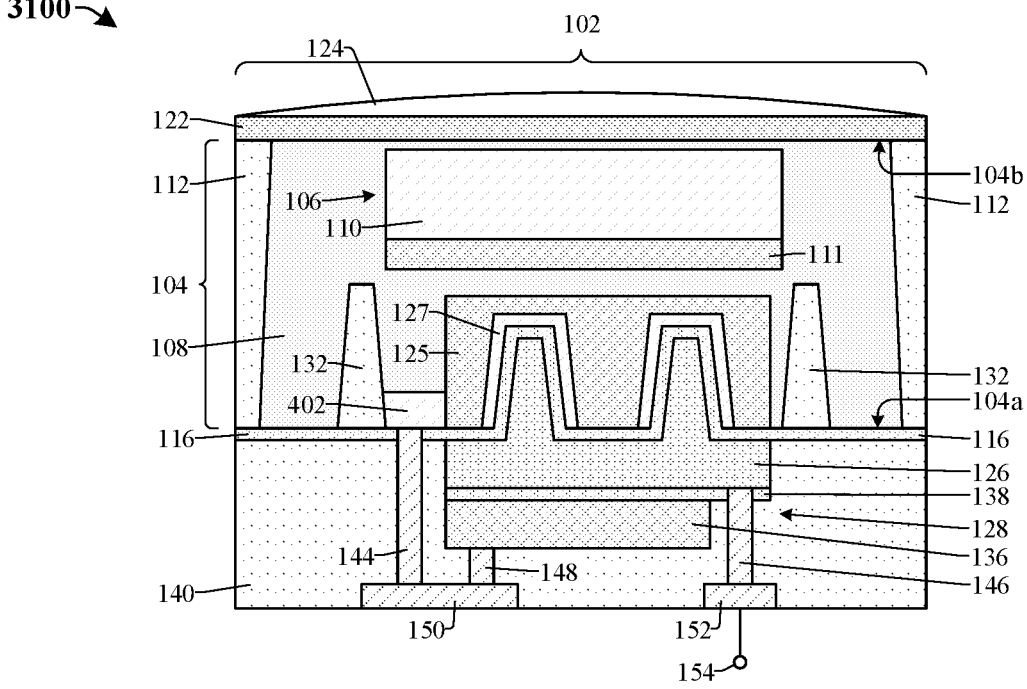

As shown in cross-sectional view 3100 of FIG. 31, a color filter 122 and a micro-lens 124 are formed over the second side 104b of the substrate 104.

FIG. 32 illustrates a flow diagram of some embodiments of a method 3200 for forming an integrated chip including a pixel along a semiconductor substrate and a semiconductor capacitor along the pixel. While method 3200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 3202, form a photodetector in a semiconductor substrate. FIG. 17 illustrates a cross-sectional view 1700 of some embodiments corresponding to block 3202.

At block 3204, form a shallow trench isolation layer extending into the substrate. FIG. 18 illustrates a cross-sectional view 1800 and FIG. 19 illustrates a cross-sectional view 1900 of some embodiments corresponding to block 3204.

At block 3206, form a capacitor implant region in the substrate between sidewalls of the shallow trench isolation layer. FIG. 20 illustrates a cross-sectional view 2000 of some embodiments corresponding to block 3206.

At block 3208, etch the substrate to form one or more trenches in the capacitor implant region of the substrate. FIG. 21 illustrates a cross-sectional view 2100 of some embodiments corresponding to block 3208.

At block 3210, deposit a first insulator layer over the substrate and in the trench(es). FIG. 22 illustrates a cross-sectional view 2200 of some embodiments corresponding to block 3210.

At block 3212, deposit a first semiconductor layer over the first insulator layer and in the trench(es). FIG. 23 illustrates a cross-sectional view 2300 of some embodiments corresponding to block 3212.

At block 3214, deposit a second insulator layer over the first semiconductor layer. FIG. 23 illustrates a cross-sectional view 2300 of some embodiments corresponding to block 3214.

At block 3216, deposit a second semiconductor layer over the second insulator layer. FIG. 23 illustrates a cross-sectional view 2300 of some embodiments corresponding to block 3216.

At block 3218, pattern the first semiconductor layer to form a first capacitor electrode from the first semiconductor layer. FIG. 24 illustrates a cross-sectional view 2400 of some embodiments corresponding to block 3218.

At block 3220, pattern the second semiconductor layer to form a second capacitor electrode from the second semiconductor layer. FIG. 25 illustrates a cross-sectional view 2500 of some embodiments corresponding to block 3220.

At block 3222, form a deep trench isolation layer surrounding the photodetector. FIG. 29 illustrates a cross-sectional view 2900 and FIG. 30 illustrates a cross-sectional view 3000 of some embodiments corresponding to block 3222.

At block 3224, form a color filter and a micro-lens along the substrate. FIG. 31 illustrates a cross-sectional view 3100 of some embodiments corresponding to block 3224.

Thus, the present disclosure relates to an integrated chip and a method for forming the integrated chip, the integrated chip including a semiconductor capacitor having increased capacitance.

Accordingly, in some embodiments, the present disclosure relates to an integrated chip including a semiconductor substrate, the semiconductor substrate including a first region having a first doping type, a second region having a second doping type, different than the first doping type, and a third region having the second doping type. A photodetector is in the semiconductor substrate. The photodetector is formed, at least in part, by the first region and the second region. A first capacitor electrode is over the third region of the semiconductor substrate. The first capacitor electrode includes a semiconductor. A first insulator layer is between the first capacitor electrode and the third region. A capacitor is along the semiconductor substrate. The capacitor is formed, at least in part, by the first capacitor electrode, the third region, and the first insulator layer. The capacitor extends directly over the photodetector.

In other embodiments, the present disclosure relates to an integrated chip including a semiconductor substrate, the semiconductor substrate including a bulk region having a first doping type and a capacitor implant region having a second doping type, different than the first doping type. A photodetector is in the semiconductor substrate. A transfer transistor is disposed along the semiconductor substrate. A first source/drain of the transfer transistor is coupled to the photodetector and a second source/drain of the transfer transistor is coupled to the capacitor implant region. A first capacitor electrode is over the capacitor implant region. The first capacitor electrode includes a semiconductor. A first insulator layer is between the first capacitor electrode and the capacitor implant region. A capacitor is disposed along the semiconductor substrate. The capacitor is formed, at least in part, by the first capacitor electrode, the capacitor implant region, and the first insulator layer. The semiconductor substrate has a pair of sidewalls delimiting a trench in the capacitor implant region of the semiconductor substrate. The first capacitor electrode and the first insulator layer extend below a top surface of the semiconductor substrate and between the pair of sidewalls of the semiconductor substrate.

In yet other embodiments, the present disclosure relates to a method for forming an integrated chip. The method includes forming a photodetector and a capacitor implant region in a semiconductor substrate. The semiconductor substrate is etched to form a trench in the capacitor implant region of the semiconductor substrate. A first insulator layer is deposited over the semiconductor substrate and in the trench. A first semiconductor layer is deposited over the first insulator layer and in the trench. A second insulator layer is deposited over the first semiconductor layer. A second semiconductor layer is deposited over the second insulator layer. The first semiconductor layer is etched to form a first capacitor electrode from the first semiconductor layer. The second semiconductor layer is etched to form a second capacitor electrode from the second semiconductor layer. The second capacitor electrode is over the first capacitor electrode. The first capacitor electrode is over the capacitor implant region and extends into the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a semiconductor substrate comprising a first region having a first doping type, a second region having a second doping type, different than the first doping type, and a third region having the second doping type;
   a photodetector in the semiconductor substrate, the photodetector being formed, at least in part, by the first region and the second region;

a first capacitor electrode over the third region of the semiconductor substrate, the first capacitor electrode comprising a semiconductor;
   a first insulator layer between the first capacitor electrode and the third region; and
   a capacitor along the semiconductor substrate, the capacitor being formed, at least in part, by the first capacitor electrode, the third region, and the first insulator layer, the capacitor extending directly over the photodetector,
   wherein the photodetector is buried in the semiconductor substrate below a first side of the semiconductor substrate, and wherein the capacitor is arranged along the first side of the semiconductor substrate.

2. The integrated chip of claim 1, wherein the first capacitor electrode forms a first electrode of the capacitor, and wherein the third region forms a second electrode of the capacitor.

3. The integrated chip of claim 1, further comprising:
   a second capacitor electrode over the first capacitor electrode; and
   a second insulator layer between the first capacitor electrode and the second capacitor electrode,
   wherein the capacitor is further formed by the second capacitor electrode and the second insulator layer.

4. The integrated chip of claim 3, wherein the first capacitor electrode forms a first electrode of the capacitor, wherein the second capacitor electrode is coupled to the third region, and wherein the second capacitor electrode and the third region form a second electrode of the capacitor.

5. The integrated chip of claim 4, wherein sidewalls of the semiconductor substrate delimit a trench in the third region of the semiconductor substrate, and wherein the first capacitor electrode and the first insulator layer extend below a top surface of the semiconductor substrate and between the sidewalls of the semiconductor substrate.

6. The integrated chip of claim 1, wherein sidewalls of the semiconductor substrate delimit a trench in the third region of the semiconductor substrate, and wherein the first capacitor electrode and the first insulator layer extend below a top surface of the semiconductor substrate and between the sidewalls of the semiconductor substrate.

7. The integrated chip of claim 6, wherein the semiconductor substrate further comprises a fourth region having the first doping type, the fourth region extending along the sidewalls of the semiconductor substrate between the sidewalls of the semiconductor substrate and the third region.

8. The integrated chip of claim 1, wherein the semiconductor substrate further comprises a fourth region neighboring the third region, the fourth region having the second doping type.

9. The integrated chip of claim 8, wherein the semiconductor substrate further comprises a fifth region neighboring the third region, the fifth region having the second doping type, wherein the fourth region and the fifth region are on opposite sides of the third region, and wherein the fourth region forms a first source/drain of a transistor, the fifth region forms a second source/drain of the transistor, the third region forms a channel of the transistor, and the first capacitor electrode forms a gate of the transistor.

10. The integrated chip of claim 1, the semiconductor substrate further comprising a fourth region having the first doping type and extending between the second region and the third region.

11. An integrated chip comprising:

a semiconductor substrate comprising a bulk region having a first doping type and a capacitor implant region having a second doping type, different than the first doping type;

a photodetector in the semiconductor substrate;

a transfer transistor disposed along the semiconductor substrate, wherein a first source/drain of the transfer transistor is coupled to the photodetector and a second source/drain of the transfer transistor is coupled to the capacitor implant region;

a first capacitor electrode over the capacitor implant region, the first capacitor electrode comprising a semiconductor; and a first insulator layer between the first capacitor electrode and the capacitor implant region; and a capacitor disposed along the semiconductor substrate, the capacitor being formed, at least in part, by the first capacitor electrode, the capacitor implant region, and the first insulator layer, wherein the semiconductor substrate has a pair of sidewalls delimiting a trench in the capacitor implant region of the semiconductor substrate, and wherein the first capacitor electrode and the first insulator layer extend below a top surface of the semiconductor substrate and between the pair of sidewalls of the semiconductor substrate.

12. The integrated chip of claim 11, further comprising:

a second capacitor electrode overlying the first capacitor electrode; and a second insulator layer between the second capacitor electrode and the first capacitor electrode, wherein the first capacitor electrode forms a first electrode of the capacitor, and wherein the second capacitor electrode and the capacitor implant region form a second electrode of the capacitor.

13. The integrated chip of claim 11, wherein the semiconductor substrate further comprises a protective implant region having the first doping type, the protective implant region extending along the trench between the pair of sidewalls of the semiconductor substrate and the capacitor implant region.

14. The integrated chip of claim 11, wherein the photodetector is buried in the semiconductor substrate below a first side of the semiconductor substrate, and wherein the capacitor is arranged along the first side of the semiconductor substrate and extends directly over the photodetector.

15. The integrated chip of claim 11, further comprising:

a shallow trench isolation layer in the semiconductor substrate and on opposite sides of the first capacitor electrode, wherein a bottom surface of the first capacitor electrode is between the pair of sidewalls of the semiconductor substrate and below a bottom surface of the shallow trench isolation layer.

16. The integrated chip of claim 11, further comprising:

a shallow trench isolation layer in the semiconductor substrate and on opposite sides of the first capacitor electrode, wherein a bottom surface of the first capacitor electrode is above a bottom surface of the shallow trench isolation layer.

17. A method for forming an integrated chip, the method comprising:

forming a photodetector and a capacitor implant region in a semiconductor substrate;

etching the semiconductor substrate to form a trench in the capacitor implant region of the semiconductor substrate;

depositing a first insulator layer over the semiconductor substrate and in the trench;

depositing a first semiconductor layer over the first insulator layer and in the trench;

depositing a second insulator layer over the first semiconductor layer;

depositing a second semiconductor layer over the second insulator layer;

etching the first semiconductor layer to form a first capacitor electrode from the first semiconductor layer; and etching the second semiconductor layer to form a second capacitor electrode from the second semiconductor layer, wherein the second capacitor electrode is over the first capacitor electrode, and wherein the first capacitor electrode is over the capacitor implant region and extends into the trench.

18. The method of claim 17, wherein the photodetector is formed buried in the semiconductor substrate and the first capacitor electrode is formed directly over the photodetector.

19. The method of claim 17, further comprising:

forming a trench isolation layer in the semiconductor substrate and on opposite sides of the first capacitor electrode.

20. The method of claim 17, further comprising:

forming a first conductive contact coupled to the capacitor implant region and adjacent to the first capacitor electrode;

forming a second conductive contact on the first capacitor electrode;

forming a third conductive contact on the second capacitor electrode;

forming a first conductive line on the first conductive contact and the third conductive contact; and forming a second conductive line on the second conductive contact.

* * * * *